United States Patent
Yamazaki et al.

(10) Patent No.: US 7,163,848 B2
(45) Date of Patent: Jan. 16, 2007

(54) SEMICONDUCTOR DEVICE AND MANUFACTURING METHOD THEREOF

(75) Inventors: Shunpei Yamazaki, Tokyo (JP); Jun Koyama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 603 days.

(21) Appl. No.: 09/894,950

(22) Filed: Jun. 27, 2001

(65) Prior Publication Data

US 2002/0005905 A1    Jan. 17, 2002

(30) Foreign Application Priority Data

Jun. 28, 2000    (JP)    ............... 2000-194222

(51) Int. Cl.
 *H01L 21/00* (2006.01)
(52) U.S. Cl. ............... 438/149; 257/72; 257/E21.051; 257/E21.411
(58) Field of Classification Search ............... 438/149, 438/56, 57, 66, 69, 72, 455, 431, 433, 75, 438/692, 435; 257/199, 281, 75, E21.051, 257/E21.411, E21.412, E21.415, E21.416, 257/72; 349/43
See application file for complete search history.

(56) References Cited

U.S. PATENT DOCUMENTS

| | | | |
|---|---|---|---|
| 5,079,606 A | 1/1992 | Yamamura et al. | 357/23 |
| 5,585,951 A * | 12/1996 | Noda et al. | 349/122 |
| 5,605,847 A | 2/1997 | Zhang | 438/166 |
| 5,637,894 A * | 6/1997 | Hori et al. | 257/249 |
| 5,643,801 A | 7/1997 | Ishihara et al. | 438/151 |
| 5,818,552 A | 10/1998 | Sato | 349/43 |
| 5,853,960 A * | 12/1998 | Tran et al. | 430/321 |
| 5,886,364 A | 3/1999 | Zhang | |
| 5,889,302 A | 3/1999 | Liu | 257/351 |
| 5,891,764 A | 4/1999 | Ishihara et al. | 438/151 |
| 5,966,193 A | 10/1999 | Zhang et al. | 349/110 |
| 6,067,131 A | 5/2000 | Sato | 349/43 |
| 6,100,954 A * | 8/2000 | Kim et al. | 349/138 |

(Continued)

FOREIGN PATENT DOCUMENTS

EP    0 450 941 A2    10/1991

(Continued)

OTHER PUBLICATIONS

Yamazaki, et al., U.S. Appl. No. 09/797,186 (pending), filed Mar. 2, 2001, "Semiconductor Device and Manufacturing Method Thereof", pp. 70 specification, pp. 26 claims (claims 80), pp. 1 abstract, Figs. 1-24, one table.

(Continued)

*Primary Examiner*—Caridad Everhart
(74) *Attorney, Agent, or Firm*—Fish & Richardson P.C.

(57) ABSTRACT

OFF current of a TFT is reduced. There is provided a semiconductor device includung: a substrate; a shielding film formed so as to be in contact with the substrate; a planarization insulating film formed on the substrate so as to cover the shielding film; and a semiconductor layer formed so as to be in contact with the planarization insulating film. The semiconductor device is characterized in that the shielding film overlaps the semiconductor layer with the planarization insulating film sandwiched therebetween, and that the planarization insulating film is polished by CMP before the semiconductor layer is formed.

78 Claims, 20 Drawing Sheets

U.S. PATENT DOCUMENTS

| | | | |
|---|---|---|---|
| 6,198,133 B1 | 3/2001 | Yamazaki et al. | |
| 6,243,155 B1 | 6/2001 | Zhang et al. | 349/199 |
| 6,252,248 B1 | 6/2001 | Sano et al. | 257/37 |
| 6,259,200 B1* | 7/2001 | Morita et al. | 313/498 |
| 6,294,815 B1 | 9/2001 | Yamazaki et al. | |
| 6,326,249 B1 | 12/2001 | Yamazaki et al. | |
| 6,327,006 B1* | 12/2001 | Sato et al. | 349/44 |
| 6,331,473 B1* | 12/2001 | Hirabayashi | 438/455 |
| 6,335,540 B1 | 1/2002 | Zhang | 257/53 |
| 6,340,830 B1 | 1/2002 | Takemura | |
| 6,380,561 B1 | 4/2002 | Ohtani et al. | 257/72 |
| 6,392,255 B1 | 5/2002 | Shibata et al. | |
| 6,396,105 B1 | 5/2002 | Yamazaki et al. | |
| 6,462,806 B1 | 10/2002 | Zhang et al. | 349/199 |
| 6,555,420 B1 | 4/2003 | Yamazaki | 438/158 |
| 6,567,136 B1* | 5/2003 | Sakuramoto et al. | 349/43 |
| 6,573,589 B1 | 6/2003 | Zhang | 257/53 |
| 6,576,926 B1 | 6/2003 | Yamazaki et al. | 257/66 |
| 6,583,472 B1 | 6/2003 | Shibata et al. | |
| 6,630,722 B1* | 10/2003 | Aoki | 257/435 |
| 6,638,800 B1 | 10/2003 | Ishihara et al. | 438/166 |
| 6,740,938 B1 | 5/2004 | Tsunoda et al. | 257/365 |
| 2002/0142512 A1* | 10/2002 | Ma et al. | 438/100 |

FOREIGN PATENT DOCUMENTS

| | | |
|---|---|---|
| EP | 0 762 180 A1 | 3/1997 |
| EP | 0 997 769 | 5/2000 |
| EP | 1 081 676 A1 | 3/2001 |
| EP | 1 087 438 A2 | 3/2001 |
| JP | 59-121876 | 7/1984 |
| JP | 07-130652 | 5/1995 |
| JP | 08-078329 | 3/1996 |
| JP | 09-043639 | 2/1997 |
| JP | 10-031235 | 2/1998 |
| JP | 10-135468 | 5/1998 |
| JP | 10-135469 | 5/1998 |
| JP | 10-189999 | 7/1998 |
| JP | 11-08776 | 3/1999 |
| JP | 11-087726 | 3/1999 |
| JP | 2000-010120 | 1/2000 |
| JP | 3141860 | 12/2000 |

OTHER PUBLICATIONS

Yamazaki, et al., U.S. Appl. No. 09/809,646 (pending), filed Mar. 16, 2001, "Semiconductor Display Device and Manufacturing Method Thereof", pp. 57 specification, pp. 11 claims (claims 25); pp. 1 abstract, Figs. 1-23.

Hirai et al.; "A High-Aperture-Ratio a-Si TFT Liquid Crystal Light Valve for Workstations"; *NEC Research & Development 35*, No. 2; pp. 165-170; Apr. 1994.

Kumar et al.; "Kink-free Polycrsytalline Silicon Double-Gate Elevated-Channel Thin-Film Transistors"; *IEEE Transactions on Electron Devices*, vol. 45, No. 1; pp. 2514-2520; Dec. 1998.

Yoo et al.; "Pixel Design for TFT-LCD with Double Gate Poly-Si TFT and Double Valve Layer Storage Capacitor"; School of Electrical Engineering, Seoul National University, Seoul, Korea, Samsung Electronics Co., Ltd.; *Proceedings of the Fourth Asian Symposium on Information Display*; pp. 219-222; 1997.

\* cited by examiner

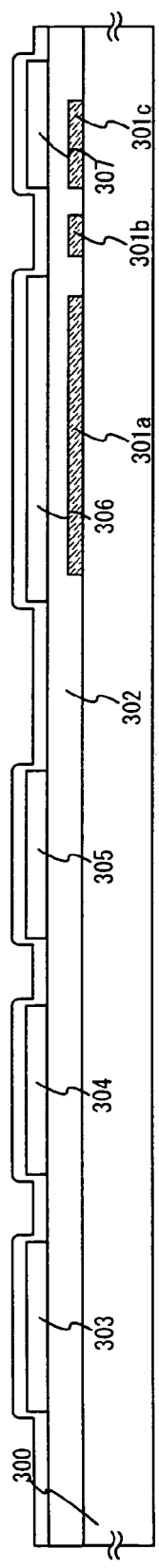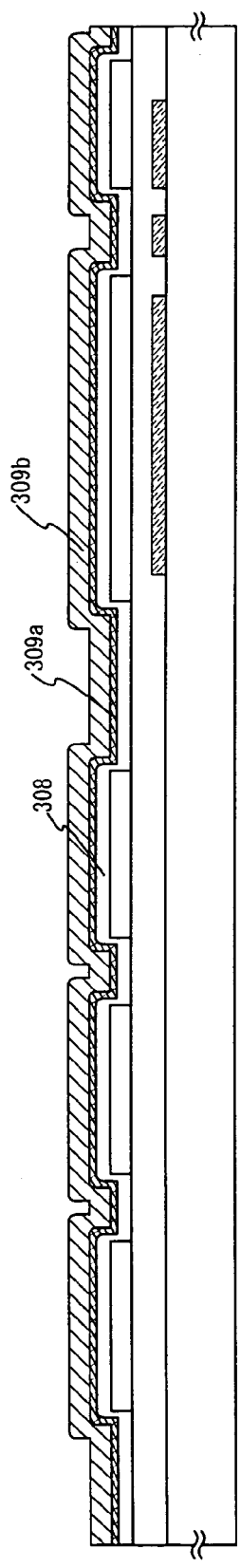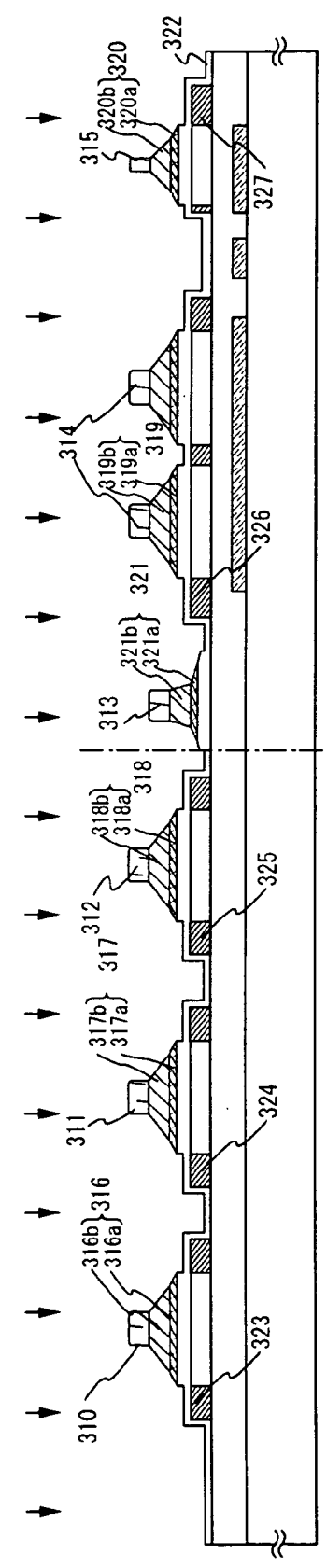

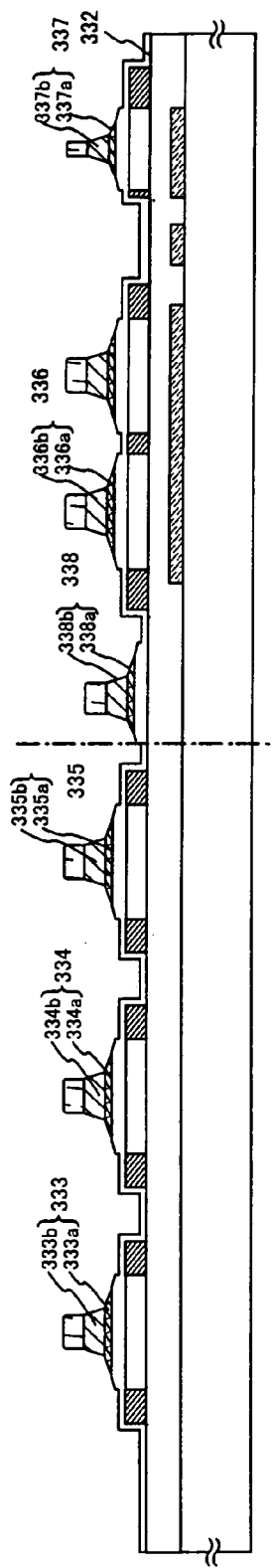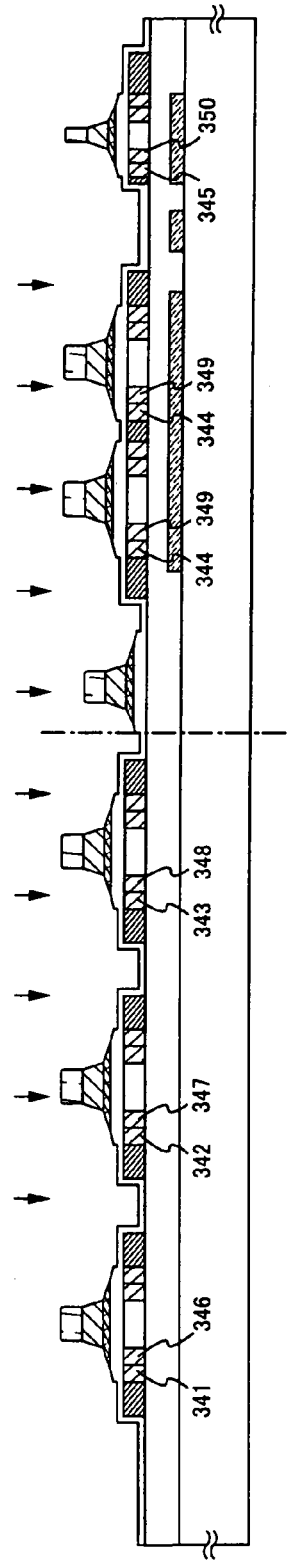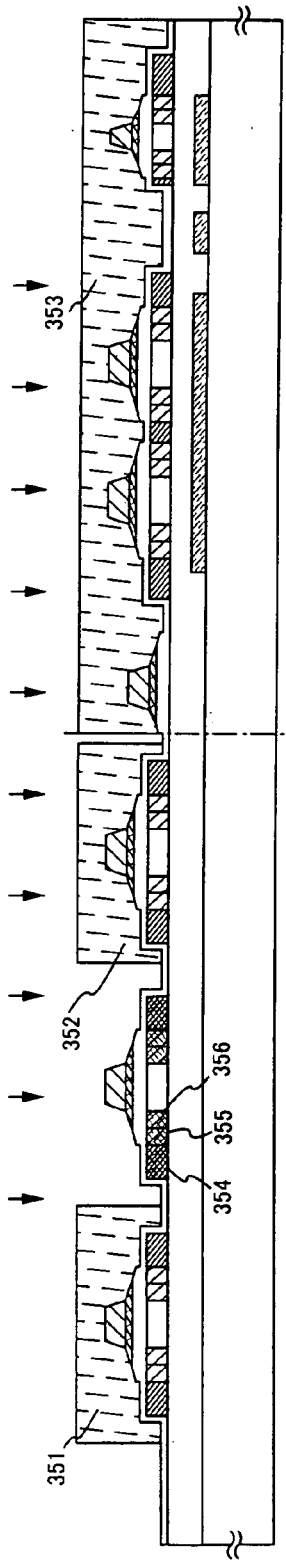

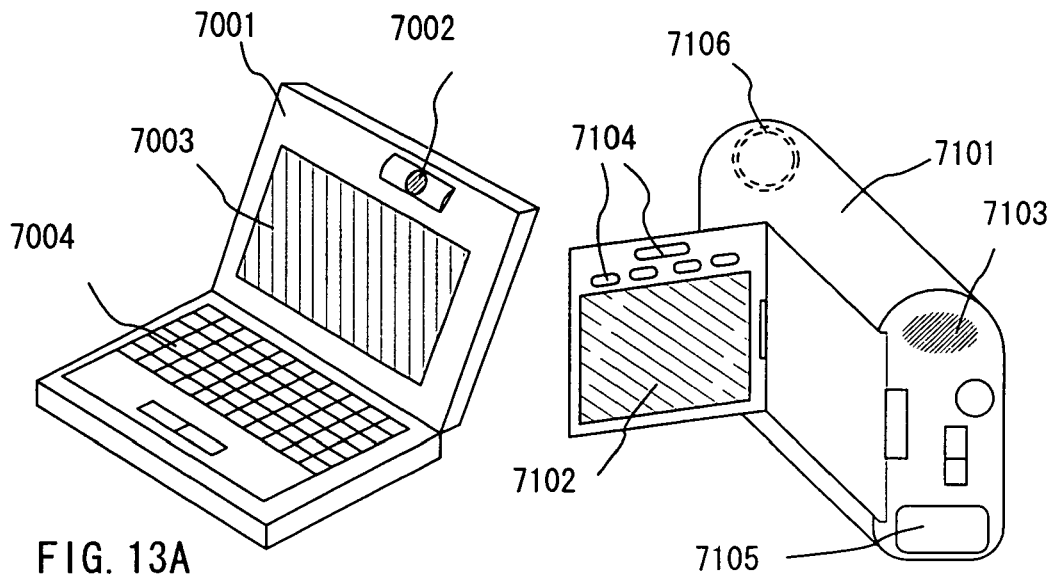
FIG. 13A
FIG. 13B
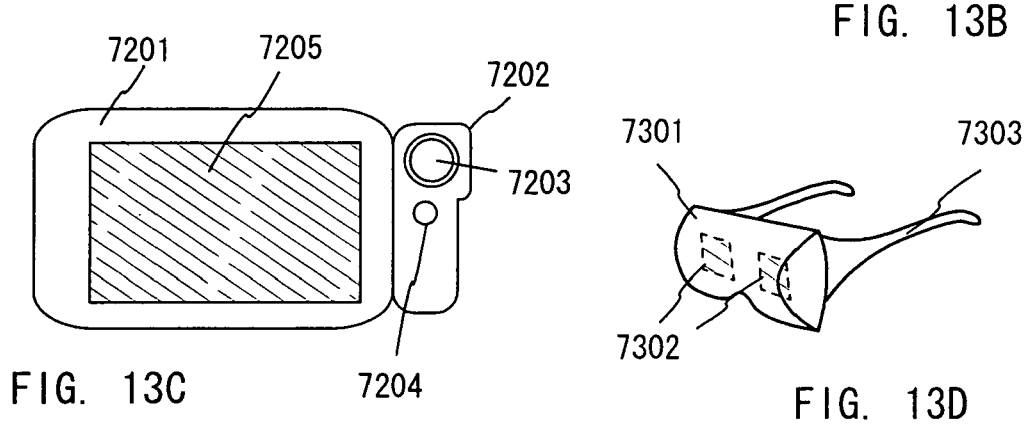
FIG. 13C
FIG. 13D
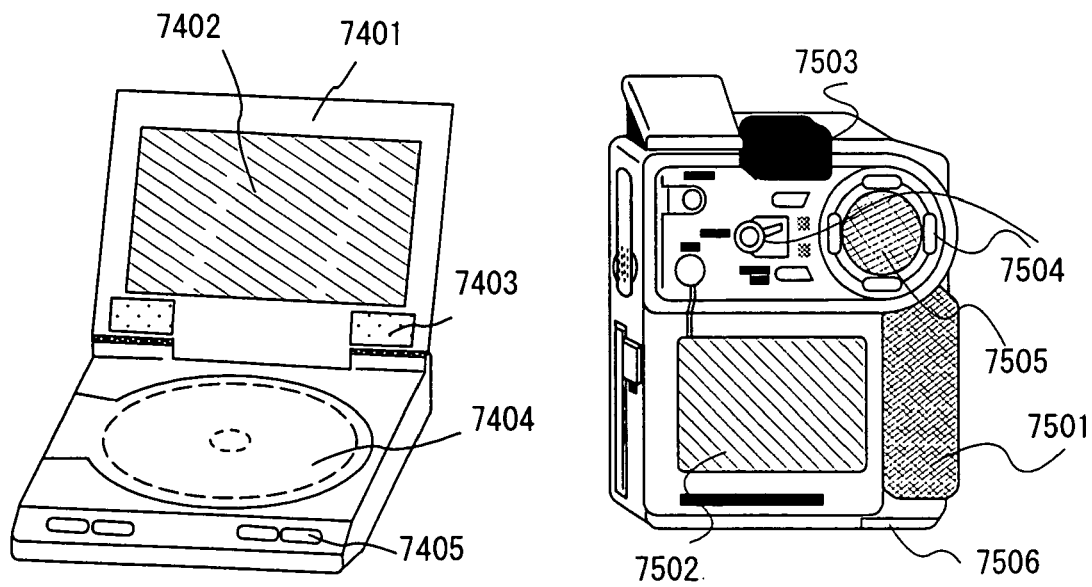
FIG. 13E
FIG. 13F

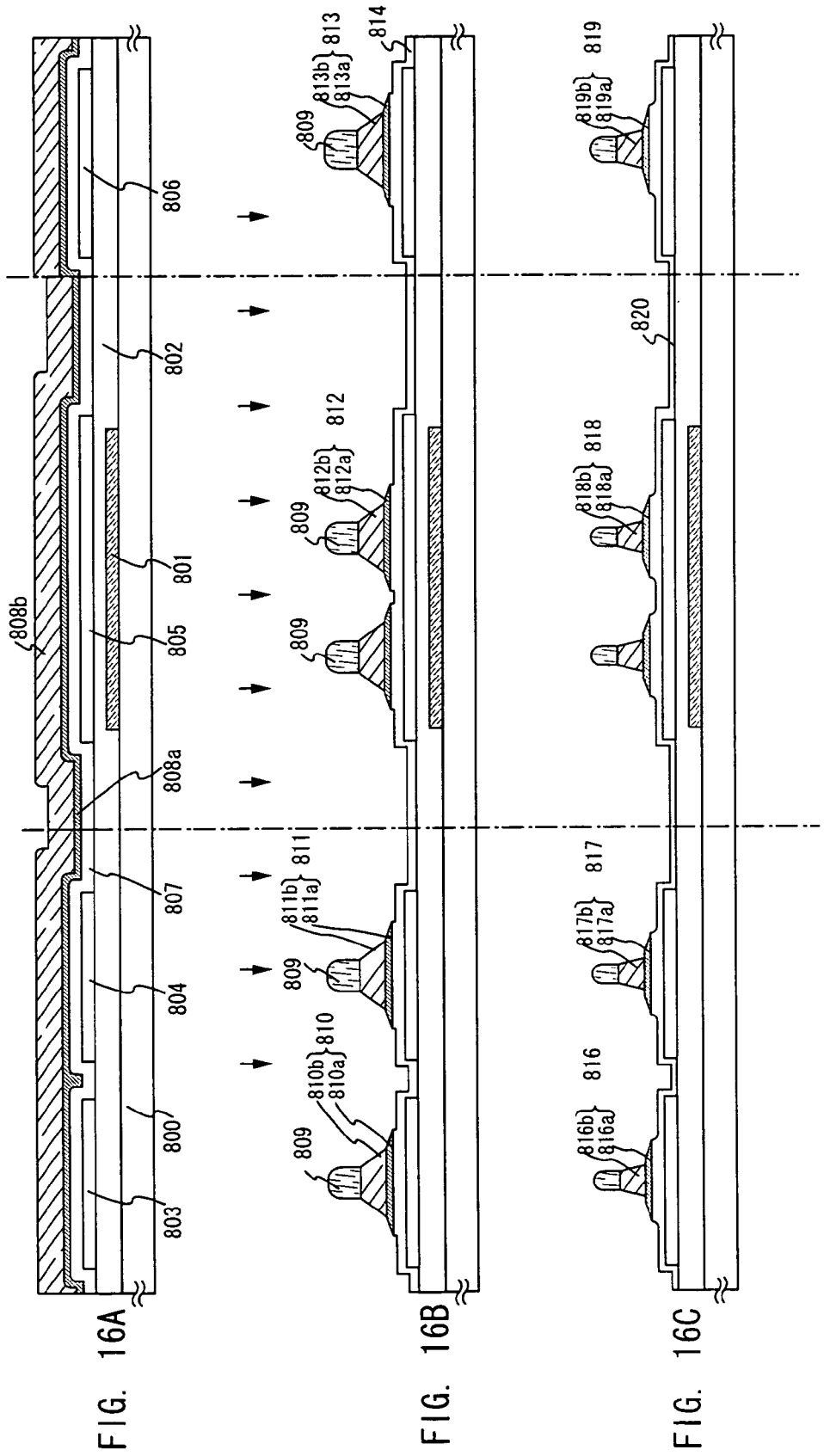

SEMICONDUCTOR DEVICE AND MANUFACTURING METHOD THEREOF

BACKGROUND OF THE INVENTION

1. Field of the Invention

The present invention relates to a semiconductor device using a semiconductor element (an element that is formed of a semiconductor film), particularly, to a liquid crystal display. The present invention also relates to electronic equipment employing the liquid crystal display for a display unit.

2. Description of Related Art

A technique that has been attracting attention in recent years is to fabricate a thin film transistor (TFT) using a semiconductor film (with a thickness on the order of several nm to several hundreds nm) that is formed on a substrate having an insulating surface. The thin film transistor is applied to a wide range of electronic devices, including ICs and semiconductor devices. Its application to a switching element for a liquid crystal display is especially desired to be developed swiftly.

An active matrix liquid crystal display has a pixel portion comprising a plurality of pixels, each of which has a TFT (pixel TFT) and a liquid crystal cell. The liquid crystal cell has a pixel electrode, an opposite electrode, and a liquid crystal interposed between the pixel electrode and the opposite electrode. The pixel TFT controls the voltage applied to the pixel electrode, whereby an image is displayed in the pixel portion.

A TFT whose active layer is formed of a semiconductor film having a crystal structure (a crystalline TFT) has high mobility. Therefore the crystalline TFT makes it possible to integrate functional circuits on the same substrate so that the liquid crystal display thus constructed can display an image with high definition.

In this specification, the semiconductor film having a crystal structure includes a single crystal semiconductor, a polycrystalline semiconductor, a microcrystalline semiconductor, and semiconductors disclosed in Japanese Patent Application Laid-open Nos. Hei 7-130652, Hei 8-78329, Hei 10-135468 and Hei 10-135469.

In fabricating the active matrix liquid crystal display, a million to two million crystalline TFTs are needed in the pixel portion alone. In addition, the functional circuits to be provided in the periphery of the pixel portion also comprises crystalline TFTs to increase the total number of required crystalline TFTs. The liquid crystal display has to meet the strict standard and the reliability of each crystalline TFT has to be solid in order to achieve a stable image display.

Characteristics of the TFT can be divided into characteristics in ON state and characteristics in OFF state. The characteristics in ON state include ON current. mobility, S value and threshold. Of the characteristics in OFF state, OFF current is an important characteristic.

The liquid crystal display employing the thin film transistor (TFT) is frequently used as a light bulb in liquid crystal projectors and the like.

Projected light in projectors generally has an intensity of about million lux. Most parts of projected light irradiate the pixel electrode whereas a part of the projected light enters the active layer of the TFT provided on an active matrix substrate. When the projected light enters a channel formation region of the active layer, in particular, a photoelectric current is generated in the region due to photoelectric effect to thereby increase OFF current of the TFT undesirably.

It is thus indispensable to set a shielding film capable of shielding against light (black matrix) so as to prevent external light from entering the active layer of the TFT. Generally, the shielding film is provided on an opposite substrate or on the active matrix substrate.

In the case of providing the shielding film on the opposite substrate, however, the bonding technique currently used takes too large margin for positioning of the shielding film on the opposite substrate and the aperture ratio is lowered as a result. Therefore this arrangement of the shielding film might not remain suitable considering the expected trend toward miniaturization of semiconductor elements.

On the other hand, in the case of providing the shielding film on the active matrix substrate, the shielding film is formed usually above a transistor and a wiring that do not require to transmit visible light, with an interlayer insulating film interposed between the shielding film and the transistor and the wiring. This structure takes only a limited margin for positioning of the shielding film, and therefore can improve the aperture ratio.

Still, light can enter the active layer of the TFT from the active matrix substrate side if there is reflection light reflected at the surface of the active matrix substrate when the projected light passes through the liquid crystal display, or if plural liquid crystal displays are used in order to obtain color display and there is light that has passed through the other liquid crystal displays. In those cases, the shielding film of the above configuration has difficulties in suppressing OFF current of the TFT.

SUMMARY OF THE INVENTION

The present invention has been made in view of the above, and an object of the present invention is therefore to provide a semiconductor device having a shielding film that is capable of preventing a TFT from increasing its OFF current because of incident light coming from the active matrix substrate side.

The inventors of the present invention have thought of forming a shielding film between an active matrix substrate and an active layer of a TFT in order to prevent light coming from the active matrix substrate side from entering the active layer of the TFT. According to this, the shielding film is covered with an insulating film and the active layer of the TFT is formed on the insulating film.

However, if the shielding film causes unevenness in the surface of the insulating film, the unevenness in turn deforms the active layer of the TFT and a characteristic of the TFT formed on the uneven insulating film is poor. To be specific, the mobility is undesirably increased.

Although the surface of the insulating film can be planar if the insulating film is sufficiently thick, forming a thick insulating film takes time and it is no help in cutting the required time for the whole process of manufacturing the liquid crystal display. Moreover, increased thickness is accompanied with increased risks of the is substrate being bent and of the insulating film itself being peeled off the substrate due to the stress of the insulating film.

Then, the inventors of the present invention have thought out to form a shielding film on an active matrix substrate, cover the shielding film by forming an insulating film, and then polish the insulating film through CMP, i.e., Chemical-Mechanical Polishing.

CMP is a method of leveling the surface chemically and mechanically with the surface of a polishing subject set as the reference. In general, the method uses a platen or a polishing plate and a polishing cloth or a polishing pad (hereinafter in this specification, generically referred to as pad) that is adhered to the top face of the platen. The platen and the polishing subject are individually rotated or swung while slurry is supplied between the polishing subject and the pad, so that the surface of the polishing subject is polished by a combination of chemical effect and mechanical effect.

With the above structure, the surface of the insulating film can be leveled to avoid giving the TFT to be formed on the insulating film a poor characteristic. The polishing by CMP also helps to reduce the bending of the substrate which is caused by the stress of the insulating film, to a certain degree.

The shielding film can block light from the active matrix substrate side which otherwise would irradiate the channel formation region of the TFT, thereby preventing the light from increasing OFF current of the TFT. Being formed on the active matrix substrate side, the shielding film needs only a limited margin for positioning itself, thereby improving the aperture ratio.

The shielding film can be formed above the TFT and a wiring with an interlayer insulating film interposed between the shielding film and the TFT and the wiring, in addition to employing the structure of the present invention, namely, forming the shielding film between the active layer of the TFT and the substrate. Then light can more securely be prevented from entering the active layer, in particular, the channel formation region.

When the shielding film is formed between the active matrix substrate and the active layer of the TFT, the wiring may be formed simultaneously. If the same material is used for the wiring and the shielding film and if the wiring is a gate signal line or a source signal line, image disturbance (discrimination) caused by orientation disorder in a liquid crystal material between pixels can be prevented.

According to the present invention, the insulating film formed so as to cover the shielding film may be an inorganic material or an organic material. However it has to be a material that can be polished by CMP. The insulating film may be formed in two or more layers. In this case, the insulating film in the first layer is polished by CMP and the second layer of insulating film and higher are then layered on the polished first layer of insulating film. Alternatively, the polishing by CMP may be performed on several layers of insulating films at once.

Hereinbelow the structure of the present invention is shown.

According to the present invention, there is provided a semiconductor device comprising:

a shielding film formed on an insulating surface;

a planarization insulating film formed on the insulating surface so as to cover the shielding film; and a semiconductor layer formed so as to be in contact with the planarization insulating film, characterized in that:

the shielding film overlaps the semiconductor layer with the planarization insulating film sandwiched therebetween; and the planarization insulating film is polished by CMP before the semiconductor layer is formed.

According to the present invention, there is provided a semiconductor device comprising:

a shielding film formed on an insulating surface;

a planarization insulating film formed on the insulating surface so as to cover the shielding film; and a thin film transistor including an active layer, the transistor being formed so as to be in contact with the planarization insulating film, characterized in that:

the active layer has a channel formation region;

the shielding film overlaps the entire channel formation region with the planarization insulating film sandwiched therebetween; and the planarization insulating film is polished by CMP before the active layer is formed.

According to the present invention, there is provided a semiconductor device comprising:

a lower layer capacitance wiring formed on an insulating surface;

a planarization insulating film formed on the insulating surface so as to cover the lower layer capacitance wiring; and a capacitance wiring formed so as to be in contact with the planarization insulating film, characterized in that:

the lower layer capacitance wiring overlaps the capacitance wiring with the planarization insulating film sandwiched therebetween; and the planarization insulating film is polished by CMP before the capacitance is wiring is formed.

According to the present invention, there is provided a semiconductor device comprising:

a shielding film, a lower layer capacitance wiring and a lower layer wiring that are formed on an insulating surface;

a planarization insulating film formed on the insulating surface so as to cover the shielding film, the lower layer capacitance wiring and the lower layer wiring;

a thin film transistor including an active layer, the transistor being formed so as to be in contact with the planarization insulating film; and a capacitance wiring formed so as to be in contact with the planarization insulating film, characterized in that:

the active layer has a channel formation region;

the shielding film overlaps the entire channel formation region with the planarization insulating film sandwiched therebetween;

the lower layer capacitance wiring overlaps the capacitance wiring with the planarization insulating film sandwiched therebetween;

the thin film transistor has a gate electrode electrically connected to the lower layer wiring; and the planarization insulating film is polished by CMP before the active layer is formed.

According to the present invention, there is provided a method of manufacturing a semiconductor device, comprising the steps of:

forming a shielding film that is in contact with an insulating surface;

forming an insulating film on the insulating surface so as to cover the shielding film;

polishing the insulating film by CMP to form a planarization insulating film; and forming a semiconductor layer such that it is in contact with the planarization insulating film, characterized in that the shielding film overlaps the semiconductor layer with the planarization insulating film sandwiched therebetween.

According to the present invention, there is provided a method of manufacturing a semiconductor device, comprising the steps of:

forming a shielding film that is in contact with an insulating surface:

forming an insulating film on the insulating surface so as to cover the shielding film;

polishing the insulating film by CMP to form a planarization insulating film; and forming a thin film transistor including an active layer such that it is in contact with the planarization insulating film, characterized in that:

the active layer has a channel formation region; and the shielding film overlaps the entire channel formation region with the planarization insulating film sandwiched therebetween.

According to the present invention, there is provided a method of manufacturing a semiconductor device, comprising the steps of:

forming a lower layer capacitance wiring that is in contact with an insulating surface;

forming an insulating film on the insulating surface so as to cover the lower layer capacitance wiring;

polishing the insulating film by CMP to form a planarization insulating film; and forming a capacitance wiring such that it is in contact with the planarization insulating film, characterized in that the lower layer capacitance wiring overlaps the capacitance wiring with the planarization insulating film sandwiched therebetween.

According to the present invention, there is provided a method of manufacturing a semiconductor device, comprising the steps of:

forming a shielding film, a lower layer capacitance wiring and a lower layer wiring that are in contact with an insulating surface;

forming an insulating film on the insulating surface so as to cover the shielding film, the lower layer capacitance wiring and the lower layer wiring;

polishing the insulating film by CMP to form a planarization insulating film; and forming on the planarization insulating film a capacitance wiring and a thin film transistor that includes an active layer, characterized in that:

the active layer has a channel formation region;

the shielding film overlaps the entire channel formation region with the planarization insulating film sandwiched therebetween;

the lower layer capacitance wiring overlaps the capacitance wiring with the planarization insulating film sandwiched therebetween; and the thin film transistor has a gate electrode electrically connected to the lower layer wiring.

According to the present invention, there is provided a method of manufacturing a semiconductor device as claimed in claim 26, characterized in that the shielding film, the lower layer capacitance wiring and the lower layer wiring each has a thickness of 0.1 µm to 0.5 µm.

According to the present invention, there is provided a method of manufacturing a semiconductor device as claimed in claim 26 or 27, characterized in that the shielding film, the lower layer capacitance wiring and the lower layer wiring are tapered around their edges.

According to the present invention, a method of manufacturing a semiconductor device as claimed in any one of claims 1 through 28, characterized in that the thickness of the planarization insulating film is 0.5 µm to 1.5 µm.

The present invention is a digital camera, a video camera, a goggle type display device, an audio system, a notebook personal computer, a portable information terminal, or a DVD player.

BRIEF DESCRIPTION OF THE DRAWINGS

In the accompanying drawings:

FIGS. 3A to 3C are diagrams showing a process of manufacturing a liquid crystal display according to the present invention;

FIGS. 4A to 4C are diagrams showing the process of manufacturing the liquid crystal display according to the present invention;

FIGS. 13A to 13F are diagrams showing electronic equipment that employs a liquid crystal display of the present invention;

FIGS. 16A to 16C are diagrams showing a process of manufacturing a liquid crystal display according to the present invention;

DETAILED DESCRIPTION OF THE PREFERRED EMBODIMENTS

The structure of the present invention will be described with reference to FIGS. 1A to 1C. First, a shielding film 102a, a lower layer capacitance wiring 102b and a lower layer wiring 102c are formed from the same material on a substrate 101. The substrate 101 is formed from quartz, glass or the like.

The shielding film 102a, the lower layer capacitance wiring 102b and the lower layer wiring 102c are required to have a light-shielding property, and W, WSix, Cu, Al or the like can be used to form them. Other than the materials given above, any material can be used as long as it has a light-shielding property and a conductivity and is capable of enduring the temperature during heat treatment in a later step along the process.

Figure 1A:
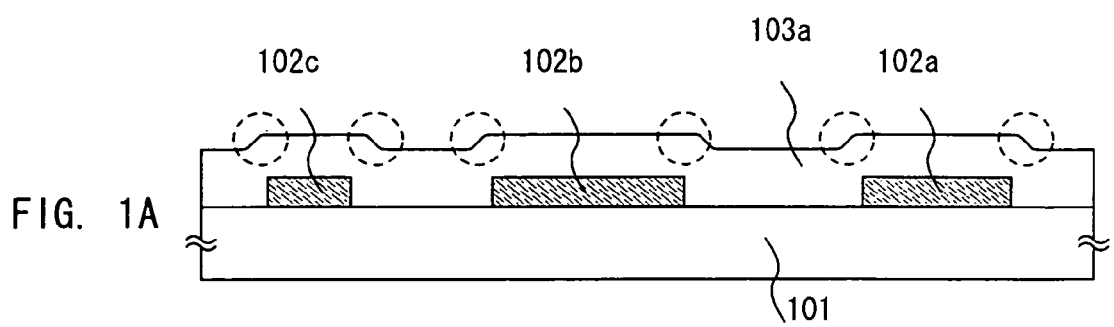
FIGS. 1A to 1C are sectional views of an active matrix substrate according to the present invention.
Figure 1B:
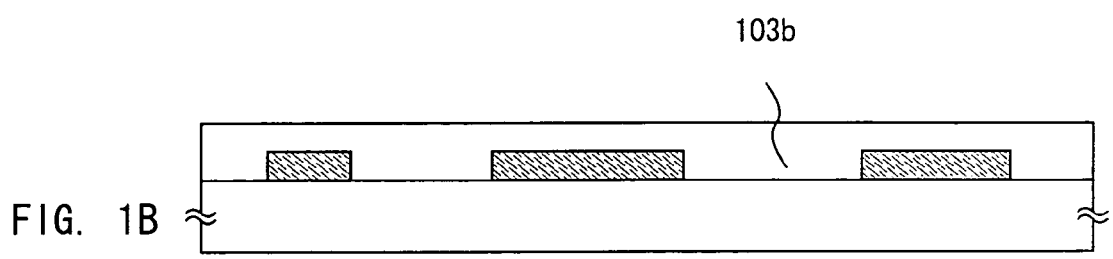
Figure 1C:
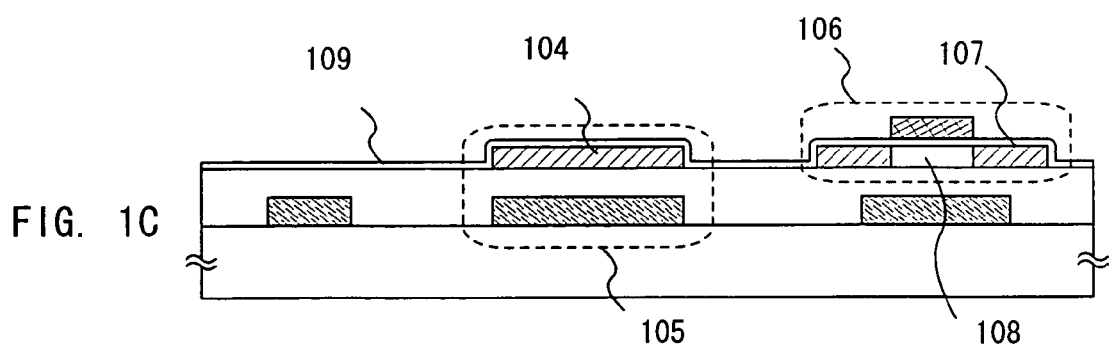

The structure shown in FIGS. 1A to 1C has all of the shielding film 102a, the lower layer capacitance wiring 102b and the lower layer wiring 102c, but the present invention is not limited thereto. Only one or two of the shielding film 102a, the lower layer capacitance wiring 102b and the lower layer wiring 102c may be formed. In the case where the shielding film 102a is formed alone, the material of the shielding film may not have a conductivity if only it is capable of shielding against light and enduring the temperature during heat treatment in a later step along the process. For example. silicon, silicon oxide or silicon oxynitride can be mixed with a black pigment to be used as the material for the shielding film.

The shielding film 102a, the lower layer capacitance wiring 102b and the lower layer wiring 102c can be formed by patterning a film of single layer or through a metal mask without patterning.

Next, an insulating film 103a is formed on the substrate 101 so as to cover the shielding film 102a, the lower layer capacitance wiring 102b and the lower layer wiring 102c. The insulating film 103a is formed from an insulating material that is capable of enduring the temperature during heat treatment in a later step along the process. (FIG. 1A)

The shielding film 102a, the lower layer capacitance wiring 102b and the lower layer wiring 102c may be tapered around their edges. Tapering the edges makes it possible to reduce unevenness in the insulating film subsequently formed and to shorten the required time for a polishing step by CMP.

The insulating film 103a is then polished by CMP. The slurry, pad and CMP apparatus to be used in this CMP step may be known ones, and the polishing method to be employed here may also be a known one.

The unevenness in the surface of the insulating film 103a (corresponding to regions circled by dotted lines in FIG. 1A) is leveled through the polishing by CMP. The insulating film 103a after receiving the leveling is referred to as planarization onsulating film 102b. (FIG. 1B.)

The surface of the planarization insulating film 103b is then washed. Thereafter, a capacitance wiring 104 is formed from silicon so as to be in contact with the planarization insulating film 103b above the lower layer capacitance wiring 102b . The lower layer capacitance wiring 102b, the planarization insulating film 103b and the capacitance wiring 104 together form a capacitor 105.

An active layer 107 of a TFT 106 is formed so as to be in contact with the planarization insulating film 103b above the shielding film 102a. The active layer 107 has a channel formation region 108, and the entire channel formation region 108 overlaps the shielding film 102a through the planarization insulating film 103b.

A gate insulating film 109 is formed on the planarization insulating film 103b so as to cover the capacitance wiring 104 and the active layer 107.

The TFT 106 may be formed by any process in steps subsequent to formation of the planarization insulating film 103b. Although the TFT 106 is a top gate TFT in this embodiment mode, it may instead be a bottom gate TFT.

The semiconductor layer formed on the planarization insulating film 103b is used as the active layer 107 of the TFT 106 in this embodiment mode. However, the present invention is not limited thereto. The semiconductor layer may be used for other semiconductor elements. For instance, the semiconductor layer may overlap the shielding film with the planarization film sandwiched therebetween so that a diode is formed on the planarization insulating film and only light coming from the opposite side of the substrate enter the diode.

With the above structure, the present invention can prevent light coming from the substrate 101 side from entering the channel formation region 108 of the TFT 106. Moreover, this invention can prevent level discontinuity between the active layer 107 of the TFT 106 and the capacitance wiring 104 which are formed on the insulating film covering the shielding film 102a, the lower layer capacitance wiring 102b and the lower layer wiring 102c without increasing the thickness of the insulating film because the surface thereof is leveled to form the planarization insulating film 103b. The present invention is thus also capable of avoiding an increase in mobility of the TFT 106.

Embodiments of the present invention will be described below.

[Embodiment 1]

Figure 2:
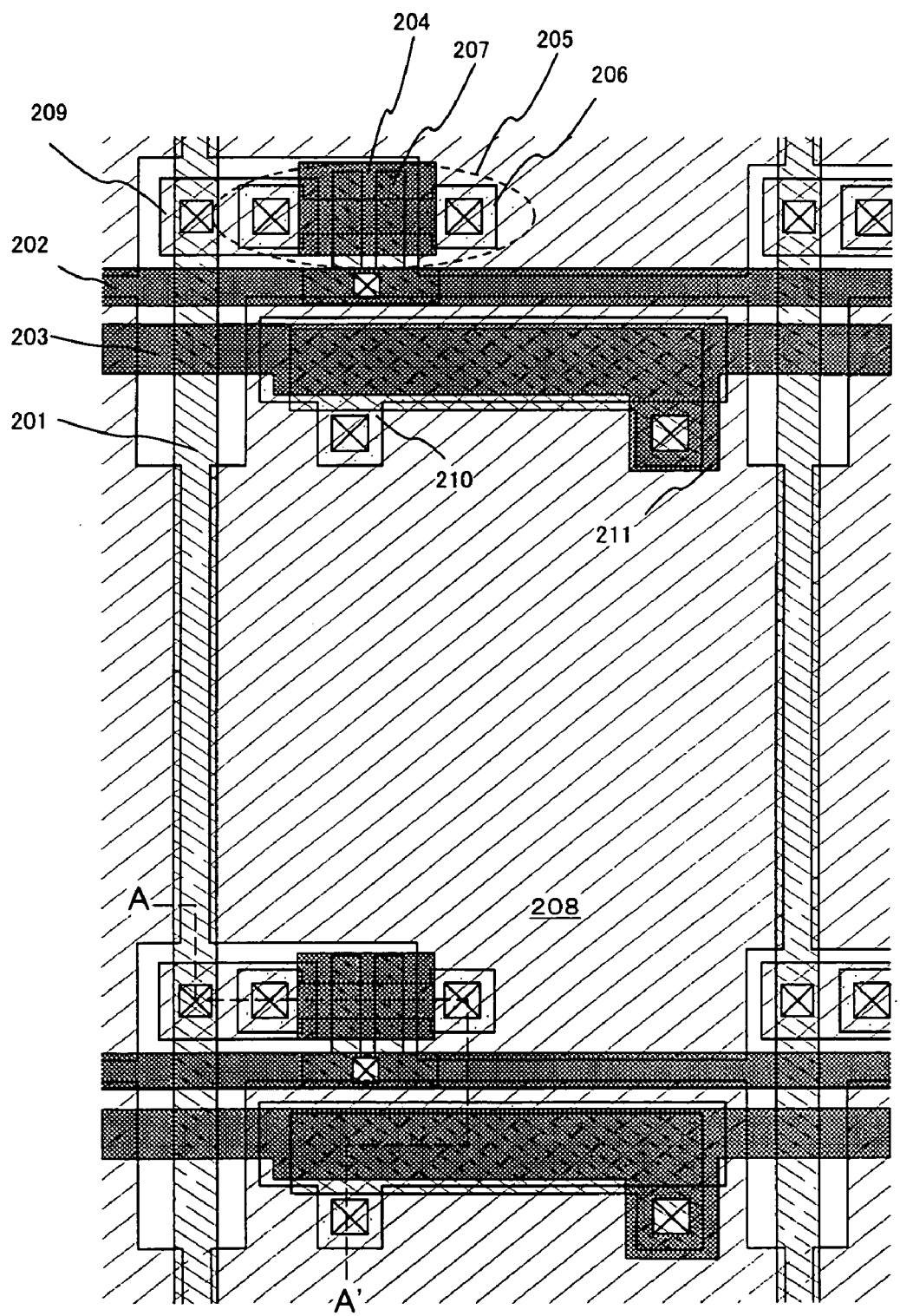
FIG. 2 is a top view of a pixel according to the present invention.

A top surface diagram of an example of a liquid crystal display with a light shielding film of the present invention is shown in FIG. 2.

Reference numeral 201 denotes a source signal line, and reference numeral 202 denotes a gate signal line. Reference numeral 203 is a lower layer capacitor wiring, and is provided in parallel with the gate signal line 202.

Reference numeral 205 denotes a pixel TFT, and controls input of the video signal which has been input to the source signal line 201 to the pixel electrode 208. The pixel TFT 205 has an active layer 206 and a gate electrode 207, and a channel forming region is provided in a region where the gate electrode 207 and the active layer 206 overlap. A light shielding film 204 is formed under the active layer 206, which overlaps with the entire channel forming region.

In this embodiment, the gate signal line 202 corresponds to the lower layer wiring 102c in FIG. 1. A planarization insulating film (not shown) is formed above contacting the gate signal line 202, the lower layer capacitor wiring 203 and the light shielding film.

A gate electrode 207 is electrically connected to the gate signal line 202. One of a source region and a drain region of the active layer 206 is connected to the source signal line 201 through a connecting wiring 209, and the other is connected to the pixel electrode 208

Reference numeral 210 indicates a capacitor wiring formed simultaneously as the active layer 206, and a capacitor is formed in the region where the capacitor wiring 210 and the lower layer capacitor wiring 203 overlap. Further reference numeral 211 indicates an upper layer capacitor wiring, and overlaps with the capacitor wiring 210 through the gate insulating film (not shown), and is electrically connected with the lower layer capacitor wiring 203 through the contact hole. In the region where the capacitor wiring 210 and the upper layer capacitor wiring 211 overlap is also formed a capacitor.

Since two capacitors overlap in this embodiment, a sufficient amount of storage capacitance can be obtained without degrading the aperture ratio. Further, the channel forming region of the pixel TFT 205 may be prevented from light incident from the active matrix substrate side. Note that the surface of the planarization insulating film (not shown) is leveled so that steps of the active layer 206 and the capacitor wiring 210 of the pixel TFT 205 formed on the insulating film may be prevented, and the mobility of the pixel TFT 205 can be suppressed, without the thickness of the insulating film covering the lower layer capacitor wiring 203 increasing.

Note that, the present invention is not limited to the above described pixel structure.

[Embodiment 2]

In this embodiment, a detailed description will be given of a method of fabricating a pixel portion and TFTs (n-channel TFT and p-channel TFT) of a driver circuit provided in the periphery of the pixel portion on the same substrate at the same time.

First, as shown in FIG. 3A, a light shielding film 301a, a gate signal line 301b, and a lower layer capacitor wiring 301c are formed on an active matrix substrate (hereinafter, referred to as substrate) made of glass such as barium borosilicate glass or alumino borosilicate glass, typified by #7059 glass or #1737 glass of Corning Inc, or quartz.

Next, the light shielding film 301a, a gate signal line 301b, and a lower layer capacitor wiring 301c are formed simultaneously. Specifically, W is formed with a thickness of 0.1 μm to 0.5 μm (in this embodiment 0.3 μm), and thereafter, an ICP (Inductively Coupled Plasma) etching method is used, in which $CF_4$ and $Cl_2$ are mixed in an etching gas, and an RF (13.56 MHz) power of 500 W is applied to a coil type electrode under a pressure of 1 Pa to generate plasma. An RF (13.56 MHz) power of 100 W is also applied to the side of the substrate (sample stage) and a substantially negative self bias voltage is applied.

Note that in this embodiment the light shielding film 301a, the gate signal line 301b, and the lower layer capacitor wiring 301c are formed of W, but the present invention is not limited to this. Materials other than W such as WSix, Cu and Al may be used. Further in addition to the above described materials, any material with a light shielding property and a conductive property, and has resistance to the treatment temperature in the subsequent processes may be used.

Next an insulating film formed of silicon oxide is formed on the substrate 300 to cover the gate signal line 301b and the lower layer capacitor wiring 301c. As the insulating film, a silicon oxide film, a silicon nitride film or a silicon oxynitride film may be used. For example, a silicon oxynitride film fabricated from $SiH_4$, $NH_3$ and $N_2O$ by a plasma CVD method is formed to a thickness of 250 to 800 nm (preferably 300 to 500 nm), and a hydrogenated silicon oxynitride film similarly fabricated from $SiH_4$ and $N_2O$ is formed to a thickness of 250 to 800 nm (preferably 300 to 500 nm) to form a laminate. In this embodiment, the insulating film may be formed of a single layer structure of the insulating film formed of silicon oxide with a thickness of 1.0 μm (preferably 0.5 to 1.5 μm). Note that, the material of the insulating film is not limited to a silicon oxide.

The insulating film is then polished by CMP to form a planarization insulating film 302. A known CMP technique can be used here. Slurry generally used in polishing an oxide film is a solid-liquid dispersion system slurry obtained by dispersing a 100 to 1000 nmΦ abrasive in a solution containing a reagent such as a pH adjuster. This embodiment uses a silica slurry (pH=10 to 11) in which 20 wt % of fumed silica particles obtained by pyrolyzing silicon chloride gas are dispersed in a solution added with potassium hydroxide.

After forming the polarization insulating film 302, a semiconductor layers 303 to 307 to be an active layer of TFT or a capacitor wiring is formed. The semiconductor layers 303 to 307 are formed of a crystalline semiconductor film manufactured from a semiconductor film having an amorphous structure with a laser crystallization method or a known thermal crystallization method. The semiconductor layers 303 to 307 are formed with a thickness of 25 to 80 nm (preferably 30 to 60 nm). The material of the crystalline semiconductor film is not limited, but is preferably formed of silicon or a silicon germanium (SiGe) alloy.

Besides, in the case where the crystalline semiconductor film is manufactured by the laser crystallization method, a pulse oscillation type or a continuous-wave type excimer laser, YAG laser, or $YVO_4$ laser may be used. In the case where those lasers are used, it is appropriate to use a method in which laser light radiated from a laser oscillator is condensed by an optical system into a linear beam, and is irradiated to the semiconductor film. Although the conditions of the crystallization should be properly selected by an operator, in the case where the excimer laser is used, a pulse oscillation frequency is set as 300 Hz, and a laser energy density is set as 100 to 400 mJ/cm$^2$ (typically 200 to 300 mJ/cm$^2$). In the case where the YAG laser is used, it is appropriate that the second harmonic is used to set a pulse oscillation frequency as 30 to 300 kHz, and a laser energy density is set as 300 to 600 mJ/cm$^2$ (typically, 350 to 500 mJ/cm$^2$). Then, laser light condensed into a linear shape with a width of 100 to 1000 μm, for example, 400 82 m, is irradiated to the whole surface of the substrate, and an overlapping ratio (overlap ratio) of the linear laser light at this time may be set as 50 to 98%.

Next, agate insulating film 308 covering the semiconductor layer 303 to 307 is formed. The gate insulating film 308 uses a well-known method such as a plasma CVD method or a sputtering method with a thickness of 40 to 150 nm to be formed by an insulating film containing silicon. In this embodiment, a silicon oxynitride film was formed to a thickness of 120 nm. Of course, The gate insulating film is not limited to such a silicon oxynitride film and may use a single layer or a laminate structure of an insulating film containing other silicon. For example, when the silicon oxide film is used, it can be formed by plasma CVD in which TEOS (tetraethyl orthosilicate) and $O_2$ are mixed, with a reaction pressure of 40 Pa, a substrate temperature of from 300 to 400° C., and discharged at a high frequency (13.56 MHz) power density of 0.5 to 0.8 W/cm$^2$. Good characteristics as the gate insulating film can be obtained in the silicon oxide film thus manufactured by the subsequent thermal annealing at 400 to 500° C.

Then, on the gate insulating film 308, a first conductive film 309a and a second conductive film 309b are formed to form gate electrodes. In this embodiment, the first conductive film made from a TaN film with a film thickness of 50 to 100 nm and the second conductive film 309b made from a W film with a film thickness of 100 to 300 nm are formed into lamination (FIG. 3B).

The TaN film is formed by sputtering, and a Ta target is sputtered with Ar. If a proper amount of Xe or Kr is added to Ar, the internal stress of the Ta film is alleviated and the film can be prevented from peeling off. The resistivity of an α phase Ta film is about 20 μΩcm and the film is suitable for use as the gate electrode. On the other hand, the resistivity of a β phase Ta film is about 180 μΩcm and the film is not suitable for use as the gate electrode. To form a Ta film with an α phase, if a tantalum nitride with a crystalline structure near an α phase Ta film is formed with a thickness of 10 to 50 nm as a base of Ta, the Ta film with an α phase can readily be obtained.

The W film is formed by the sputtering method with a W target. The W film may be formed by thermal CVD using tungsten hexafluoride ($WF_6$). Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by sputtering using a target having a purity of 99.9999% or 99.99%, and in addition, by taking sufficient consideration to prevent impurities within the gas phase from mixing therein during the W film formation, a resistivity of from 9 to 20 μΩcm can be realized.

Note that, in this embodiment, the first conductive film 309a is made of Ta, and the second conductive film 309b is made of W, but the material is not particularly limited thereto, and either film may be formed of an element selected from Ta, W, Ti, Mo, Al, and Cu, or an alloy material or a compound material containing the above element as its main ingredient. Besides, a semiconductor film typified by a polycrystalline silicon film doped with an impurity element such as phosphorus may be used. An example of a combination in which the first conductive film 309a is formed of tantalum nitride (TaN) and the second conductive film 309b is formed of W, a combination in which the first conductive film 309a is formed of tantalum nitride (TaN) and the second conductive film 309b is formed of Al, or a combination in which the first conductive film 309a is formed of tantalum nitride (TaN) and the second conductive film is formed of Cu is preferable.

Next, masks 310 to 315 consisting of resist are formed by carrying out a first etching process for forming electrodes and wirings. In this embodiment, an ICP (Inductively Coupled Plasma) etching method is used, in which $CF_4$ and $Cl_2$ are used as the etching gases, an RF (13.56 MHz) power of 500 W is applied to a coil type electrode under a pressure of 1 Pa to generate plasma. An RF (13.56 MHz) power of 100 W is also applied to the side of the substrate (sample stage), and a substantially negative self bias voltage is applied thereto. If $CF_4$ and $Cl_2$ are mixed, the W film and the Ta film are both etched to the same degree.

Under the above first etching condition, by making the shapes of the masks consisting of resist suitable, end portions of the first conductive layer and the second conductive layer become the tapered shape by the effect of the bias voltage applied to the substrate side. The angle of the taper portion becomes 15 to 45°. In order to achieve etching free of residue, over-etching in which the etching time is prolonged by about 10 to 20% is appropriate. The selective ratio of the silicon oxynitride film to the W film ranges from 2 to 4 (typically, 3). Therefore, through the over-etching treatment, the exposed surface of the silicon oxynitride film is etched by about 20 to 50 nm. In this way, first shape conductive layers 316 to 324 consisting of the first conductive layers and the second conductive layers (the first conductive layers 316a to 321a and the second conductive layers 316b to 321b) are formed by the first etching process. Reference numeral 322 denotes a gate insulating film, and regions which are not covered with the first shape conductive layers 316 to 321 are etched by about 20 to 50 nm so that thinned regions are formed.

Then, a first doping process is performed and an impurity element that imparts an n-type is added to the semiconductor layer (FIG. 3C). Doping may be performed by ion doping or ion implanting. The condition of the ion doping method is such that a dosage is $1 \times 10^{13}$ to $5 \times 10^{14}$ atoms/cm$^2$, and an acceleration voltage is 60 to 100 keV. As the impurity element imparting the n-type, an element belonging to group 15, typically phosphorus (P) or arsenic (As) may be used, but phosphorus is used here. In this case, the conductive layers 316 to 320 become masks to the impurity element imparting the n-type, and first impurity regions 323 to 327 are formed in a self-aligning manner. The impurity element imparting the n-type in the concentration range of $1 \times 10^{20}$ to $1 \times 10^{21}$ atoms/cm$^3$ is added to the first impurity regions 323 to 327.

Next, as shown in FIG. 4A, a second etching process is performed. The ICP etching method is similarly used in which $CF_4$, and $Cl_2$ are used as the etching gases, and an RF power (13.56 MHz) of 500 W is applied to a coil type electrode under a pressure of 1 Pa to generate plasma. An RF (13.56 MHz) power of 50 W is applied to the side of the substrate (sample stage), and a low self bias voltage as compared with the first etching process is applied thereto. In accordance with the conditions, the W film is anisotropically etched, and the Ta film is anisotropically etched at an etching rate lower than the W film to form second shape conductive layers 333 to 338 (first conductive layers 333a to 338a and second conductive layers 333b to 338b). Reference numeral 332 designates a gate insulating film, and regions which are not covered with the second shape conductive layers 333 to 338 are etched into a film thickness of about 20 to 50 nm, to for thin regions.

An etching reaction to the W film or the Ta film by the mixture gas of $CF_4$ and $Cl_2$ can be guessed from a generated radical or ion species and the vapor pressure of a reaction product. When the vapor pressures of fluoride and chloride of W and Ta are compared with each other, $WF_6$ of fluoride of W is extremely high, and other $WCl_5$, $TaF_5$, and $TaCl_5$ have almost equal vapor pressures. Thus, in the mixture gas of $CF_4$ and $Cl_2$, both W and Ta films are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized a little by an addition of $O_2$. Since the oxide of Ta does not react with fluorine or chlorine, the etching rate of the Ta film is further decreased. Accordingly, it becomes possible to make a difference between the etching rates of the W film and the Ta film. with the result that it becomes possible to make the etching rate of the W film higher than that of the Ta film.

Subsequently, as shown in FIG. 4B, a second doping process is performed. In this case, a dosage is made lower than that of the first doping process, and an impurity element imparting the n-type is doped under the condition of a higher acceleration voltage. For example, an acceleration voltage is set as 70 to 120 keV, and the process is carried out at a dosage of $1 \times 10^{13}$ atoms/cm$^2$, so that new impurity regions are formed on the semiconductor layer inside the first impurity regions formed in FIG. 3C. The doping is performed in such a manner that the second shape conductive layers 333 to 337 are used as the masks to the impurity element, and the impurity element is added also to the semiconductor layer under the second shape conductive layers 333a to 337a. In this way, third impurity regions 341 to 345 overlapping with the second conductive layers 333a to 337a, l and second impurity regions 346 to 350 between the first impurity regions and the third impurity regions are formed. The impurity element imparting the n-type, is made to have a concentration of $1 \times 10^{17}$ to $1 \times 10^{19}$ atoms/cm$^3$ in the second impurity regions, and a concentration of $1\times10^{16}$ to $1\times10^{18}$ atoms/cm$^3$ in the third impurity regions.

Then, as shown in FIG. 4C, fourth impurity regions 354 to 356 in which an impurity element imparting a conductivity opposite to the one conductivity type, are formed in the semiconductor layer 304 that forms the p-channel TFT. The second conductive layer 334 is used as the mask with respect to the impurity elements, to form the fourth impurity regions in a self aligning manner. At this time, the semiconductive layers 303, 305, 306, and 307 forming the n-channel TFT is entirely covered with resist masks 351 to 353. The impurity regions 354 to 356 are doped with phosphorus in different concentrations, respectively. In this embodiment, the impurity regions 153 to 158 are formed by ion doping using diborane (B$_2$H$_6$). Doping is performed so that the concentration of the impurity in any of the regions falls within the range of $2\times10^{20}$ to $2\times10^{21}$ atoms/cm$^3$.

By the steps up to this, the impurity regions are formed in the respective semiconductor layers. The second shape conductive layers 333 to 336 overlapping with the semiconductor layers function as gate electrodes. Besides, the layer 337 functions as an upper layer capacitor wiring, and 338 functions as a source signal line.

Figure 5A:
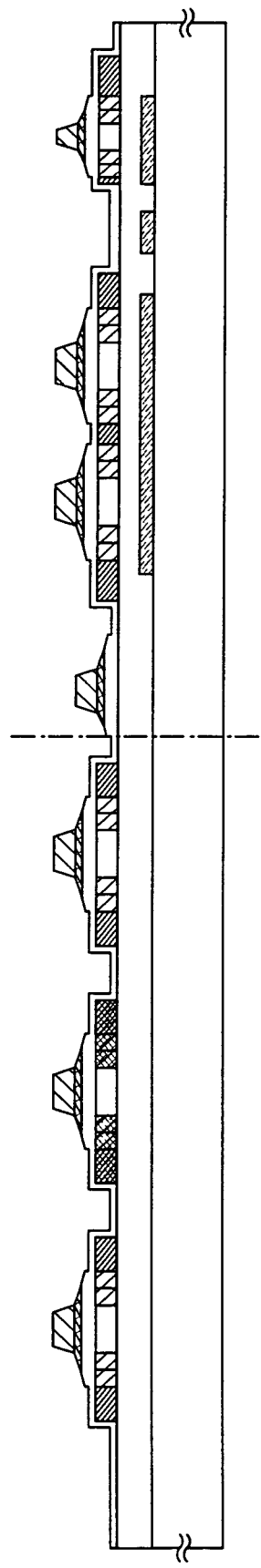
FIGS. 5A and 5B are diagrams showing the process of manufacturing the liquid crystal display according to the present invention.

Then, as shown in FIG. 5A, a step of activating the impurity elements added in the respective semiconductor layers is performed in order to control the conductivity type. This step is carried out by thermal annealing using a furnace annealing oven. Note that, other than the thermal annealing method, a laser annealing method, or a rapid thermal annealing method (RTA method) can be applied thereto. The thermal annealing may be performed in a nitrogen atmosphere having an oxygen content of 1 ppm or less, preferably 0.1 ppm or less and at 400 to 700° C., typically 500 to 600° C. In this embodiment, a heat treatment at 500° C. for 4 hours is carried out. However, when the wiring material used for 333 to 338 is weak against heat, it is preferable to conduct activation after forming the interlayer insulating film (with silicon as its main constituent) to protect the wiring and the like.

In addition, heat treatment at 300 to 450° C. for 1 to 12 hours is performed in an atmosphere containing hydrogen of 3 to 100% to perform a step of hydrogenating the semiconductor layers. This step is a step of terminating dangling bonds in the semiconductor layer by thermally excited hydrogen. As another means for hydrogenation, plasma hydrogenation (using hydrogen excited by plasma) may be carried out.

Next, a second interlayer insulating film 358 made of an organic insulating material is formed on the first interlayer insulating film 357 formed having a film thickness of 100 to 200 nm from silicon oxynitride film. Then, etching is performed for forming a contact hole Then, in a driver circuit 406, source wirings 359 to 361 are formed so as to contact the source regions of the semiconductor layer, and drain wirings 362 and 363 are formed at the same time contacting the drain regions. Further in the pixel portion 407, pixel electrodes 366 and 367, and a connecting wiring 365 are formed (See FIG. 5B). The source signal line 338 and the adjacent pixel TFT 404 are electrically connected by the connecting wiring 365. The pixel electrode 366 is electrically connected to an active layer formed from the semiconductor layer of the pixel TFT 404 and a capacitor wiring formed from the semiconductor layer 307. Note that, the pixel electrode 367 is an adjoining electrode 367.

Although not shown, an upper layer capacitor wiring 337 and a lower layer storage wiring 301c are electrically connected. A capacitor is formed from the lower layer capacitor wiring 301c, the planarization insulating film 302 and the capacitor wiring formed of the semiconductor layer 307. Further, a capacitor is formed from a capacitor wiring formed of the semiconductor layer 307, and a gate insulating film 332 and an upper layer capacitor wiring 337. These two capacitors together may be considered as the storage capacitor 405.

In the manner as described above, the driver circuit 406 including an n-channel TFT 401, a p-channel TFT 402, and a n-channel TFT 403 and the pixel portion 407 including the pixel TFT 404 and a storage capacitor 405 can be formed on the same substrate.

The n-channel TFT 401 of the driver circuit 406 includes a channel forming region 368, the third impurity region 346 (GOLD region) overlapping with the second conductive layer 333 forming the gate electrode, the second impurity region 341 (LDD region) formed outside the gate electrode, and the first impurity region 327 functioning as a source region or a drain region. The p-channel TFT 402 includes a channel forming region 369, a fourth impurity region 356 overlapping with the second conductive layer 334 forming the gate electrode, a fourth impurity region 355 formed outside the gate electrode, and the fourth impurity region 354 functioning as a source region or a drain region. The n-channel TFT 403 includes a channel forming region 370, the third impurity region 348 (GOLD region) overlapping with the second conductive layer 335 forming the gate electrode, a second impurity region 343 (LDD region) formed outside the gate electrode, and the first impurity region 329 functioning as a source region or a drain region.

The pixel TFT 404 of the pixel portion 407 includes a channel forming region 371, the third impurity region 349 (GOLD region) overlapping with the second conductive layer 336 forming the gate electrode, a second impurity region 344 (LDD region) formed outside the gate electrode, and the first impurity region 330 functioning as a source region or a drain region. Besides, in the storage capacitor 405, in the storage capacitor formed of the semiconductor layer 307, impurity elements imparting n-type are added to the region shown by 331 at the same concentration with the first impurity region, to the region shown by 345 at the same concentration with the third impurity region, to the region shown by 350 at the same concentration with the second impurity region.

The light shielding film 301a overlaps with the entire channel forming region 371 of the pixel TFT 404 through the planarization insulating film 302.

Figure 5B:
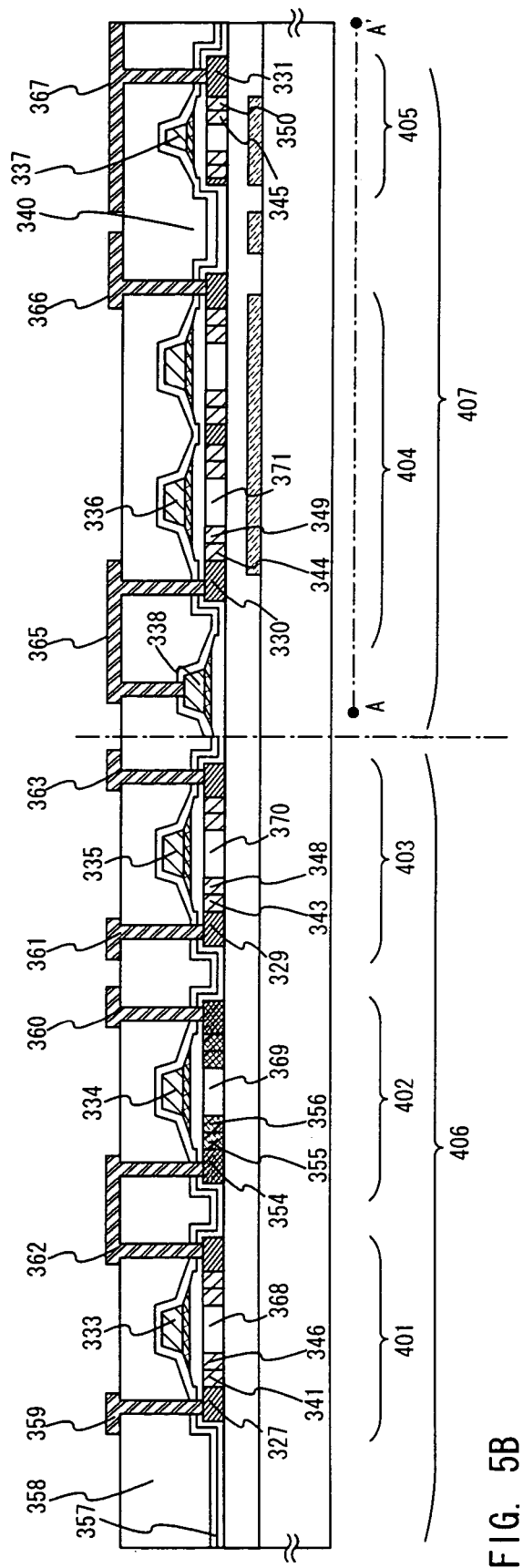

A top view of the pixel of Embodiment 1 along the line A–A' corresponds to the line A–A' in FIG. 5B. That is, the source signal line 338, the connecting wiring 365, the gate electrode 336, the light shielding film 301a, the pixel electrode 366m the gate signal line 301b, the lower layer capacitor wiring 301c, the capacitor wiring 307, the upper layer capacitor wiring 337, correspond respectively to 201, 209, 207, 204, 208, 202, 203, 210 and 211.

Further, in the pixel structure of the present invention, an end portion of the pixel electrode is formed by arranging it so as to overlap with the source signal line so that the gap between the pixel electrodes is shielded from light.

Figure 6:
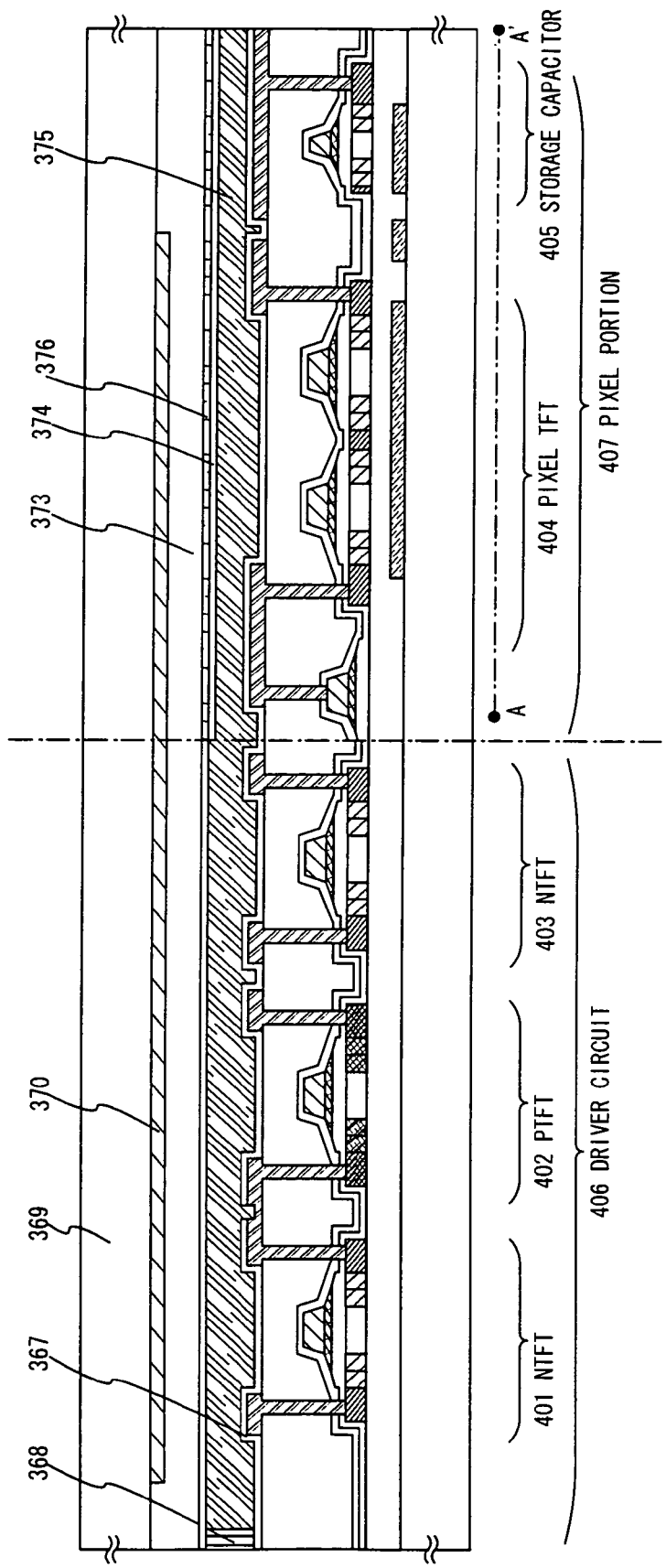
FIG. 6 is a diagram showing the process of manufacturing the liquid crystal display according to the present invention.

A manufacturing process of an active matrix liquid crystal display device from the active matrix substrate manufactured as described above will be described hereinbelow. FIG. 6 is used for an explanation thereof.

First, an active matrix substrate is obtained, and an orientation film 467 is formed on the active matrix substrate of FIG. 5B, and is subjected to a rubbing process.

Next, an opposing substrate 469 is prepared. Color filter layers 470 and an overcoat layer 473 are formed on the opposing substrate 369.

The color filter 479 is formed in accordance with the connecting wiring 365. The color filters of the respective colors are acrylic resin mixed with a pigment, and is formed to a thickness of 1 to 3 μm. A photosensitive material may be used for the color filters, and a predetermined pattern may be formed using a mask. The overcoat layer is formed of an organic resin material of a photo-curing type or a heat curing type, for example, polyamide, acrylic resin or the like.

The spacer may be arranged arbitrarily, for example, on an opposing substrate to match the position of the connecting wiring. Further, the spacer may be arranged to match the position of the TFT of the driver circuit 406. The spacer may be arranged over the entire surface of the driver circuit portion, and to cover the source wiring and the drain wiring.

After forming an overcoat layer 473, an opposing electrode 476 is formed by patterning and an orientation film 474 is formed, and is thereafter subjected to a rubbing process.

Further, an active matrix substrate, on which a pixel portion 407 and a driver circuit 406 are formed, and an opposing substrate are stuck by a sealing agent 468. In the sealing agent 468, filler is mixed, and the two substrates are stuck with each other while keeping a uniform gap by the effect of the filler and the spacer. Thereafter, a liquid crystal material is injected between both substrates, to encapsulate the substrate completely by an encapsulant (not shown). A known liquid crystal material may be used as the liquid crystal material. Thus, the active matrix liquid crystal display device shown in FIG. 6 is completed.

Note that the present embodiment is not limited to the above described manufacturing method and may be implemented in combination with Embodiment 1.

[Embodiment 3]

This embodiment gives a description of the structure of a CMP apparatus used in polishing by CMP.

Figure 7A:
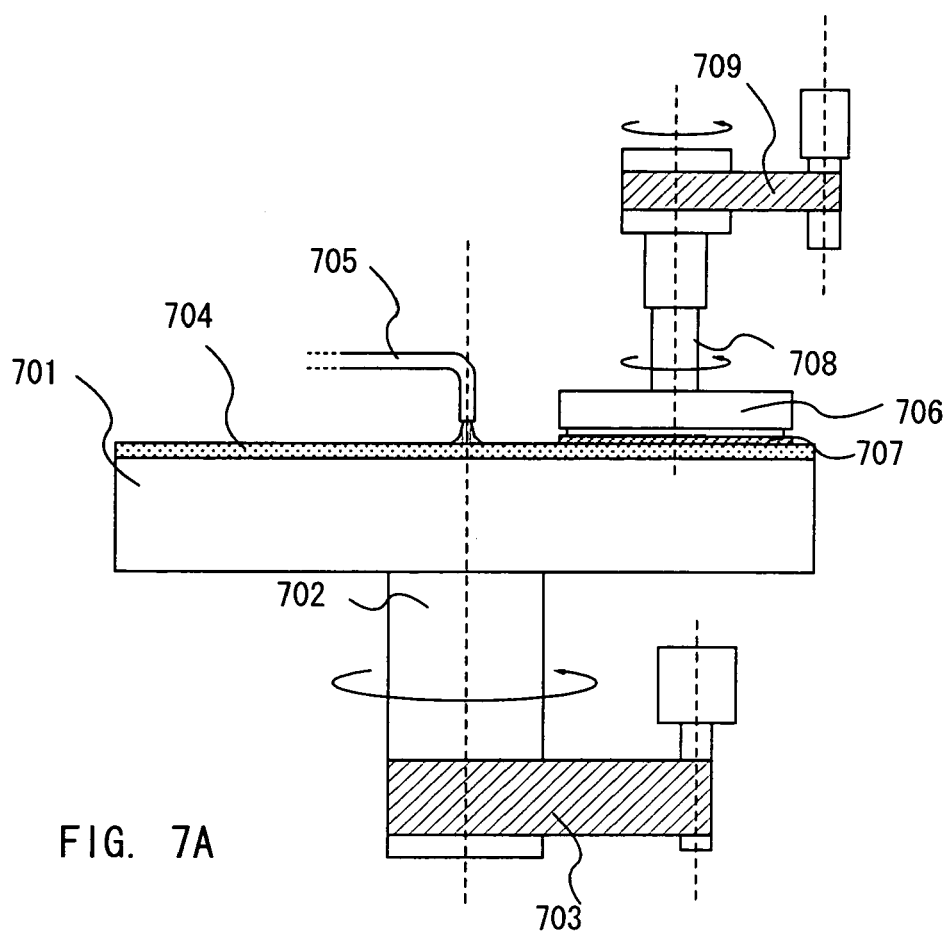
FIGS. 7A and 7B are diagrams showing a CMP apparatus.
Figure 7B:
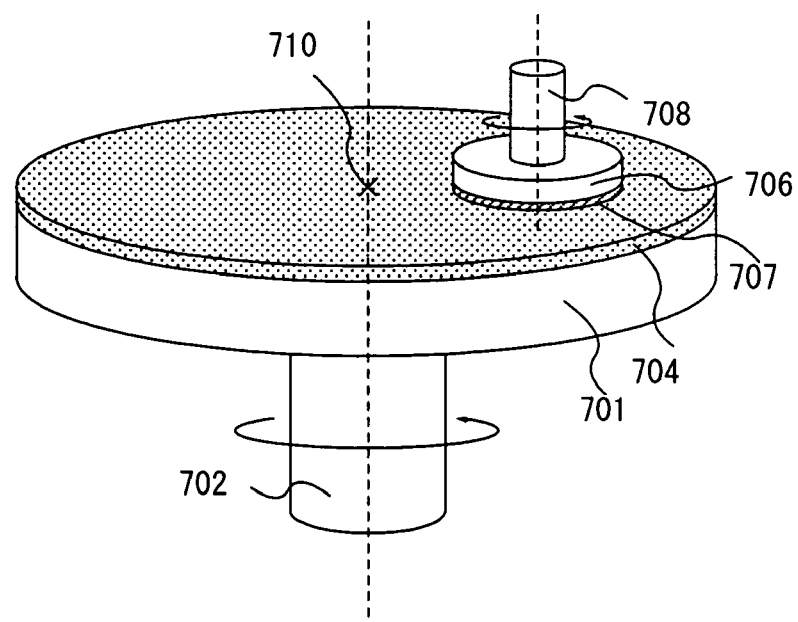

FIG. 7A shows a side view of a CMP apparatus according to this embodiment and FIG. 7B shows a perspective view thereof. Reference symbol 701 denotes a platen, which is rotated by a driving shaft (a) 702 in the direction indicated by the arrow or in the opposite direction. The driving shaft (a) 702 is fixed by an arm (a) 703 to a fixed position.

A pad 704 is placed on the platen 701. The pad 704 may be a known polishing cloth or polishing pad. Slurry is supplied to the pad 704 from a slurry supplying nozzle 705. In this embodiment, the slurry is supplied from the slurry supplying nozzle 705 to a slurry supply position 710 that is placed substantially at the center of the pad 704. A known material can be used for the slurry.

Reference symbol 706 denotes a carrier having a function of rotating an active matrix substrate 707 on the pad 704 with the substrate fixed to itself. The carrier 706 is rotated by a driving shaft (b) 708 in the direction indicated by the arrow or in the opposite direction. The driving shaft (b) 708 is fixed by an arm (a) 709 to a fixed position.

The active matrix substrate 707 is held such that its face on which an insulating film later formed into a planarization film is formed faces the pad 704.

Though not used in this embodiment, a polishing cloth may be used for the pad 704. In this case, deformation of the polishing cloth around the edge of the active matrix substrate can be limited to a small degree by providing a pad pressurizing ring. When a pressure 1.2 to 1.6 times the polishing pressure on the active matrix substrate 707 is applied to the pad pressurizing ring, the surface profile of the polishing cloth is changed to obtain a uniform deformation across the polishing cloth.

Figure 8:
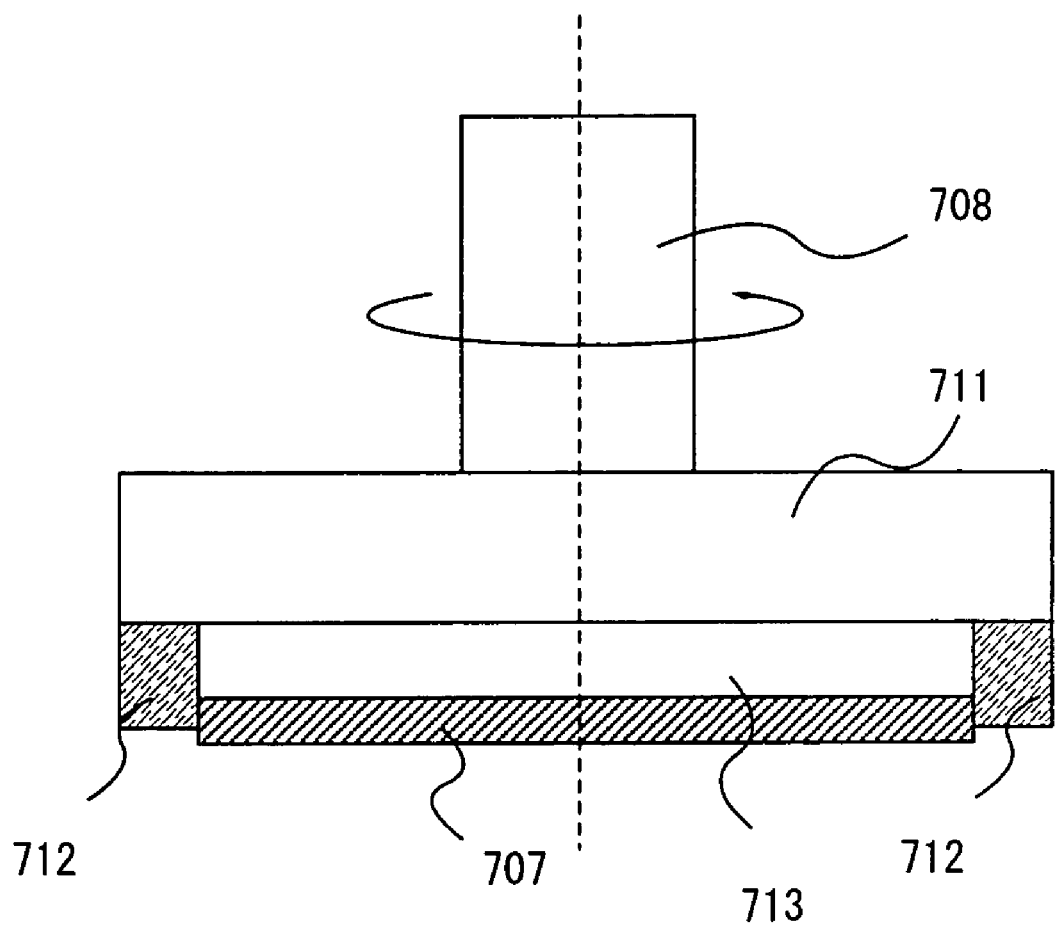
FIG. 8 is an enlarged view of a carrier.

FIG. 8 illustrates details of the carrier 706 shown in FIGS. 7A and 7B. The carrier 706 has a polish housing 711, a wafer chuck 713 and a retainer ring 712. The wafer chuck 713 holds the active matrix substrate 707, and the retainer ring 712 prevents the active matrix substrate 707 from falling off of the carrier during polishing. The polish housing 711 holds the wafer chuck 713 and the retainer ring 712 and has a function of applying polishing pressure.

The carrier 707 is required to have both the pressurizing function and rotating function. Therefore it is common that the carrier has a rotation axis in its center to apply a load along the axis. In this common method where the load is applied along the central axis, distribution of the load within the active matrix substrate plane is inevitably the highest under the central axis and decreases toward the perimeter of the plane. Accordingly a known auxiliary load mechanism may be incorporated into the polish housing so that the active matrix substrate is polished uniformly throughout the substrate plane.

This embodiment can be carried out in combination with Embodiment 1 or 2.

[Embodiment 4]

A description is given with reference to FIGS. 9A to 12B of another example, a different one from the example shown in Embodiment 2, of manufacturing a liquid crystal display that is one of the semiconductor devices according to the present invention. This embodiment gives, step by step, a detailed description of simultaneously manufacturing a pixel TFT and a capacitor storage of a pixel portion and TFTs for a source signal line driver circuit and a gate signal line driver circuit which are provided in the periphery of the pixel portion.

Figure 9A:
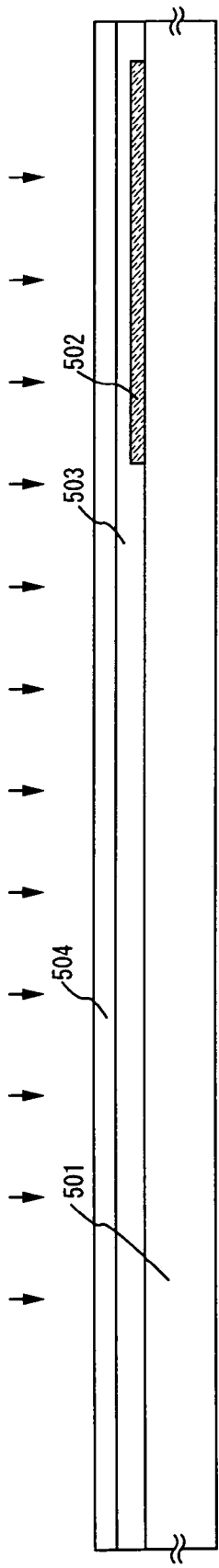
FIGS. 9A to 9C are diagrams showing a process of manufacturing a liquid crystal display according to the present invention.

In FIG. 9A, a glass substrate, a quarts substrate or the like is used as a substrate 501. The glass substrate may contain barium borosilicate glass represented by the Corning 7059 glass and the Corning 1737 glass that are products of Corning Incorporated, or alumino borosilicate grass. When the glass substrate is used, the substrate may be subjected to heat treatment in advance at a temperature 10 to 2020 C. lower than the glass distortion point. Then a shielding film 502 is formed on the substrate 501 at positions where TFTs are to be formed.

The shielding film 502 is formed by depositing W to a thickness of 0.1 μm to 0.5 μm (0.3 μm, in this embodiment), which is then etched by ICP (Inductively Coupled Plasma) etching. In the etching, an etching gas obtained by mixing $CF_4$ and $Cl_2$ is used and an RF (13.56 MHz) power of 500 W is given to a coil-formed electrode at a pressure of 1Pa to generate plasma. The substrate side (sample stage) also receives an RF (13.56 MHz) power of 100 W so that a substantially negative self-bias voltage is applied.

W is used in this embodiment to form the shielding film 502. However, the present invention is not limited thereto. Materials that can be used other than W include metals such as WSix, Cu and Al, and silicon, silicon oxide and silicon oxynitride that are mixed with a black pigment. Other than the materials mentioned above, any material can be used as long as it is capable of shielding against light and enduring the temperature during heat treatment in a later step along the process.

Next, an insulating film is formed from silicon oxide on the substrate 501 so as to cover the shielding film 502. The insulating film may be a silicon nitride film or a silicon oxynitride film instead of the silicon oxide film. For example, it may be a laminate of a silicon oxynitride film formed by plasma CVD from $SiH_4$, $NH_3$ and $N_2O$ to a thickness of 250 to 800 nm (preferably 300 to 500 nm) and a silicon oxynitride hydrogenated film similarly formed from $SiH_4$ and $N_2O$ to a thickness of 250 to 800 nm (preferably 300 to 500 nm). The insulating film here uses silicon oxide and is formed into a single layer having a thickness of 0.5 to 1.5 µm. The material of the insulating film is not limited to silicon oxide.

The insulating film is then polished by CMP to form a planarization insulating film 503. A known CMP technique can be used here. Slurry generally used in polishing an oxide film is a solid-liquid dispersion system slurry obtained by dispersing a 100 to 1000 nmΦ abrasive in a solution containing a reagent such as a pH adjuster. This embodiment uses a silica slurry (pH=10 to 11) in which 20 wt % of fumed silica particles obtained by pyrolizing silicon chloride gas are dispersed in a solution added with potassium hydroxide.

After forming the polarization insulating film 503, an amorphous semiconductor layer having an amorphous structure is formed by plasma CVD or sputtering to have a thickness of 25 to 80 nm (preferably 30 to 60 nm). Examples of a semiconductor film having an amorphous structure include an amorphous semiconductor layer, a microcrystalline semiconductor film and a compound semiconductor film having an amorphous structure such as an amorphous silicon germanium film. Contamination of the surface of the planarization insulating film 503 can thus be prevented, and fluctuation in characteristic between TFTs to be manufactured and a shift in threshold voltage can be reduced.

Crystallization is then performed to form from the amorphous semiconductor layer a crystalline semiconductor layer 504. Laser annealing, thermal annealing (solid phase growth) or rapid thermal annealing (RTA) can be employed as the method of crystallization. When a glass substrate such as the ones mentioned above is used, or a plastic substrate having an inferior heat resistance is used, laser annealing is particularly preferable. In RTA, the light source may be an infrared lamp, a halogen lamp, a metal halide lamp, a xenon lamp or the like. Alternatively the crystalline semiconductor layer 504 can be formed by a crystallization method that uses a catalytic element in accordance with the technique disclosed in Japanese Patent Application Laid-open No. Hei 7-130652. In the crystallization step, it is preferable to release hydrogen contained in the amorphous semiconductor layer in advance. The amorphous semiconductor layer is subjected to heat treatment at 400 to 500° C. for about an hour to reduce the hydrogen content in the layer to 5 atom % or less before crystallization, to thereby prevent unevenness of film surface.

The hydrogen content of the amorphous silicon film can be reduced to 5 atomic % or less also if the amorphous silicon film is formed by plasma CVD while using $SiH_4$ and argon (Ar) as a reaction gas and setting the substrate temperature during the film formation to 400 to 450° C. In this case, the heat treatment for releasing hydrogen is unnecessary.

When laser annealing is employed for the crystallization, the light source is a pulse oscillation or continuous wave excimer laser or argon laser. In the case of using a pulse oscillation excimer laser, laser light is processed into a linear shape to conduct laser annealing. Conditions of the laser annealing can be suitably set by an operator. For example, the laser pulse oscillation frequency is set to 300 Hz, and the laser energy density is set to 100 to 500 mJ/cm² (typically, 300 to 400 mJ/cm²). Then the entire surface of the substrate is irradiated with the linear beams with the overlap ratio of the linear beams being 50 to 98%. In this way, the crystalline semiconductor layer 504 can be obtained as shown FIG. 9A.

Figure 9B:
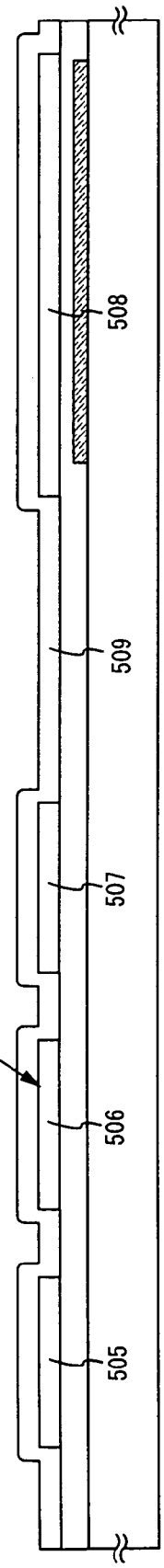

A resist pattern is formed on the crystalline semiconductor layer 504 using a first photo mask (PM1) and a photolithography technique, so that the crystalline semiconductor layer can be divided into island-like layers by dry etching. Semiconductor layers 505 to 508 are thus formed as shown in FIG. 9B. A mixture gas of $CF_4$ and $O_2$ is used in dry etching of the crystalline silicon film.

These semiconductor layers may be doped with an impurity element imparting the p type conductivity in order to control the threshold voltage (Vth) of the TFT. The entire surface of each semiconductor layer is doped with this impurity element to have a concentration of about $1\times10^{16}$ to $5\times10^{17}$ atoms/cm³. Known examples of the impurity element imparting the p type conductivity to a semiconductor include elements of Group 13 in the periodic table, such as boron (B), aluminum (Al) and gallium (Ga). Ion implantation or ion doping (or ion shower doping) can be used as the method of doping. If a large-area substrate is to be treated, ion doping is suitable. In ion doping, dibolane ($B_2H_6$) is used as a source gas and boron (B) is the dopant. Doping of an impurity element as such is not always necessary and may be omitted, but it is a preferred method especially to contain the threshold voltage of an n-channel TFT within a given range.

A gate insulating film 509 is formed by plasma CVD or sputtering from an insulating film containing silicon to a thickness of 40 to 150 nm. In this embodiment, silicon oxynitride film with a thickness of 120 nm is used. A silicon oxynitride film formed by adding $O_2$ to $SiH_4$ and $N_2$ is a material preferable as the gate insulating film 509 because the fixed electric charge density in the film is low. A silicon oxynitride film formed of $SiH_4$, $NO_2$ and $H_2$ is also preferable, for the gate insulating film formed from this film is low in interface defect density. The gate insulating film is not limited to such silicon oxynitride films, of course, but a single layer or a laminate layer of other silicon-containing films can be used as the gate insulating film. For example, a silicon oxide film may be used. The silicon oxide film is formed by plasma CVD while mixing TEOS (tetraethyl orthosilicate) with $O_2$, and discharging at a reaction pressure of 40 Pa, a substrate temperature of 300 to 400° C., and a high frequency (13.56 MHz) power density of 0.5 to 0.8 W/cm². The silicon oxide film thus formed displays excellent characteristics as the gate insulating film through a subsequent thermal annealing at 400 to 500° C. (FIG. 9B)

Figure 9C:
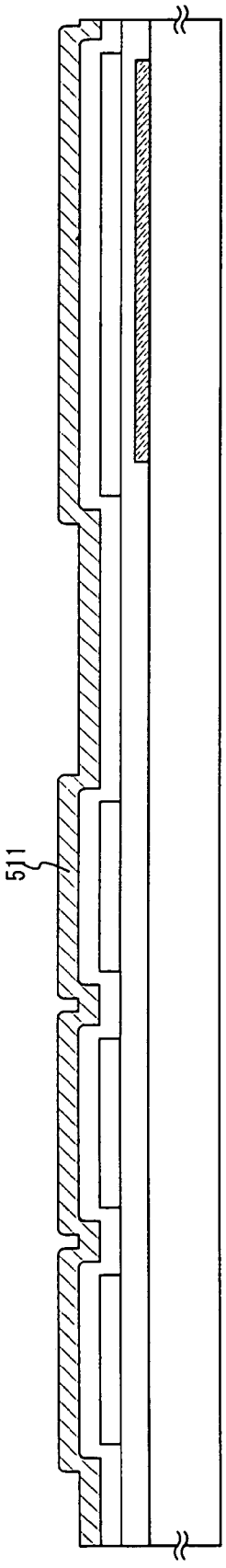

As shown in FIG. 9C, a heat resistant conductive layer 511 for forming a gate electrode is formed to a thickness of 200 to 400 nm (preferably 250 to 300 nm) on the gate insulating film 509 having a first shape. The heat resistant conductive layer 511 may be a single layer, or a laminate having a plurality of layers with the number of layers varying from two or three to more if necessary. The heat resistant conductive layer contains an element selected from the group consisting of Ta, Ti and W, or an alloy mainly containing an element selected from the above group, or an alloy film containing a combination of the elements constituting the above group. The heat resistant conductive layer is formed by sputtering or CVD. In order to lower its resistivity, the concentration of impurities contained in the layer is preferably reduced. In particular, preferable oxygen concentration thereof is 30 ppm or lower. In this embodiment, a W film having a thickness of 300 nm is formed. The W film may be formed by sputtering with W as the target, or by thermal CVD using tungsten hexafluoride ($WF_6$). In either case, the film has to be lowered in resistivity in order to use it as the gate electrode, and the resistivity of the W film is desirably 20 μΩcm or lower. The resistivity of the W film can be lowered when the grain size in the film is increased. However, if there are many impurity elements such as oxygen in the W film, crystallization is hindered and the resistivity is increased. For that reason, the W film is formed by sputtering while using a W target of 99.9999% purity and taking a great care to avoid mixing-in of impurities from the air during the film formation. As a result, the W film can have a reduced resistivity of 9 to 20 μ106 cm.

Similarly, sputtering can be employed when a Ta film is used for the heat resistant conductive film 511. In the case of the Ta film, Ar is used as a sputtering gas. If a proper amount of Xe or Kr is added to the sputtering gas, the internal stress of the film to be formed is alleviated and the film can be prevented from peeling off. The resistivity of an α phase Ta film is about 20 μΩcm and the film is suitable for use as the gate electrode. On the other hand, the resistivity of a β phase Ta film is about 180 μΩcm and the film is not suitable for use as the gate electrode. A TaN film has a crystal structure close to that of an α phase Ta film, and if the TaN film is used as the base of a Ta film, an α phase Ta film can readily be obtained. Though not shown, it is effective to form, under the heat resistant conductive layer 511, a silicon film doped with phosphorus (P) to a thickness of about 2 to 20 nm. The silicon film makes it possible to improve adhesion of the conductive film formed thereon and prevent oxidization, as well as to avoid diffusion of a minute amount of alkali metal element contained in the heat resistant conductive layer 511 into the gate insulating film 509 having the first shape. In any case, the heat resistant conductive layer 511 preferably has a resistivity of 10 to 50 μΩcm.

Next, resist masks 512 to 517 are formed using a second photo mask (PM2) and a photolithography technique. A first etching treatment is then conducted. In this embodiment, an ICP etching apparatus is employed, $Cl_2$ and $CF_4$ are mixed as an etching gas, and 3.2 W/cm² RF (13.56 MHz) power is given at a pressure of 1Pa to generate plasma. The substrate side (sample stage) also receives 224 mW/cm² RF (13.56 MHz) power so that a substantially negative self-bias voltage is applied. The rate of etching the W film under these conditions is about 100 nm/min. The first etching treatment is given a time 20% longer than an estimated time for the W film to be etched which is calculated from this etching rate.

Through the first etching treatment, conductive layers 518 to 523 having a first tapered shape are formed. The conductive layers 518 to 523 are formed such that the tapered portions have an angle of 15 to 30°. In order to achieve etching free of residue, over-etching in which the etching time is prolonged by about 10 to 20% is appropriate. The selective ratio of the silicon oxynitride film (the gate insulating film 509 having the first shape) to the W film ranges from 2 to 4 (typically, 3). Therefore, through the over-etching treatment, the exposed surface of the silicon oxynitride film is etched by about 20 to 50 nm, and a gate insulating film 580 having a second shape is formed which is tapered in the vicinity of the edges of the conductive layers 518 to 523 having the first tapered shape.

Figure 10A:
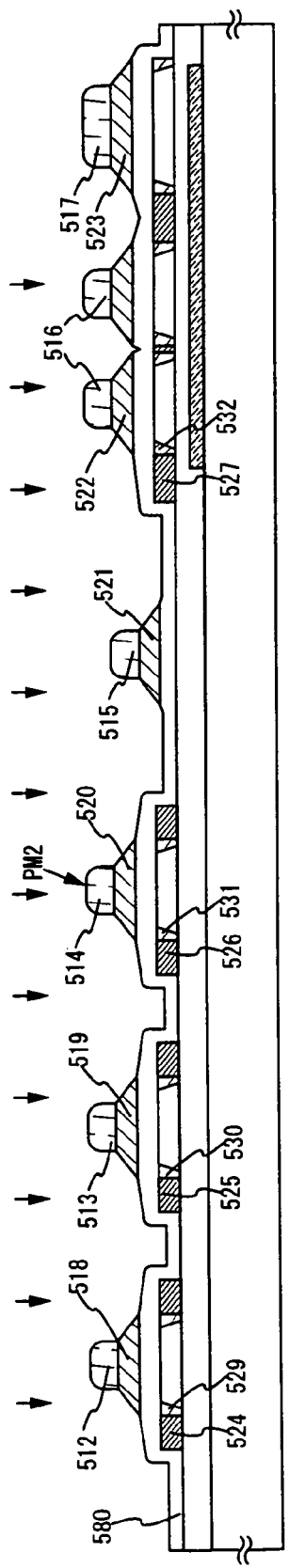
FIGS. 10A to 10C are diagrams showing the process of manufacturing the liquid crystal display according to the present invention.

A first doping treatment is conducted to dope the semiconductor layers with an impurity element with one conductivity type. Here, an impurity element imparting the n type conductivity is used for the doping step. While the masks 512 to 517 that have been used to form the conductive layers having the first shape are remained as they are, the conductive layers 518 to 523 having the first tapered shape are used as masks and the doping of the impurity element imparting the n type conductivity is conducted by ion doping in a self-aligning manner. The impurity element imparting the n type conductivity has to reach through the tapered portions of the gate electrodes around their edges and through the gate insulating film 580 having the second shape to the underlying semiconductor layers. Therefore the dose of the impurity element is set to $1 \times 10^{13}$ to $5 \times 10^{14}$ atoms/cm², and the acceleration voltage is set to 80 to 160 keV for the doping. The impurity element imparting the n type conductivity is an element belonging to Group 15 in the periodic table, typically, phosphorus (P) or arsenic (As). Phosphorus (P) is used here. Through the ion doping as above, first impurity regions 524 to 527 are doped with the impurity element imparting the n type conductivity in a concentration of $1 \times 10^{20}$ to $1 \times 10^{21}$ atomic/cm³, whereas second impurity regions (A) 529 to 532 formed below the tapered portions are doped with the impurity element imparting the n type conductivity in a concentration of $1 \times 10^{17}$ to $1 \times 10^{20}$ atomic/cm³, though the concentration is not uniform in the regions 592 to 532. (FIG. 10A)

In this step, the change in concentration of the impurity element imparting the n type conductivity in the second impurity regions (A) 529 to 532, at least in portions thereof which overlap the conductive layers 518 to 523 having the first shape, reflects the change in thickness of the tapered portions. In other words, the concentration of phosphorus (P) used to dope the second impurity regions (A) 529 to 532 is decreased toward the centers from the edges of the conductive layers 518 to 523 having the first shape in the regions where the second impurity regions (A) overlap the conductive layers. This is because the amount of phosphorus (P) reaching the semiconductor layers varies in accordance with the graduated thicknesses of the tapered portions.

Figure 10B:
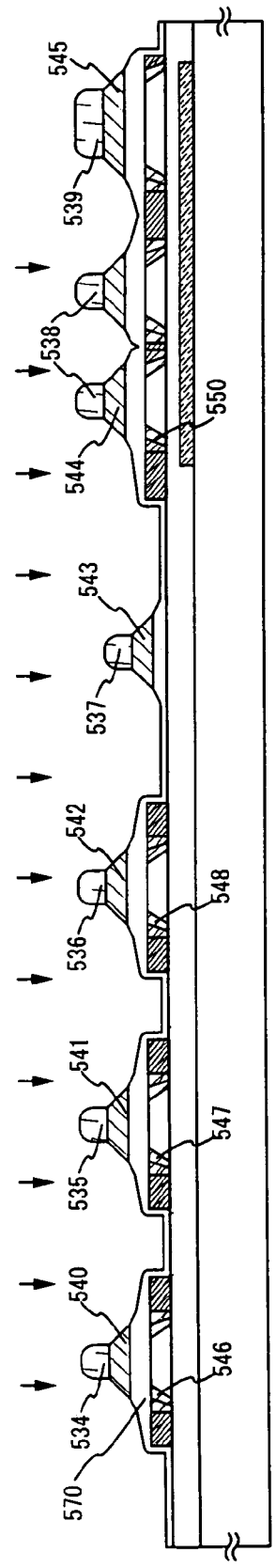
Figure 10C:
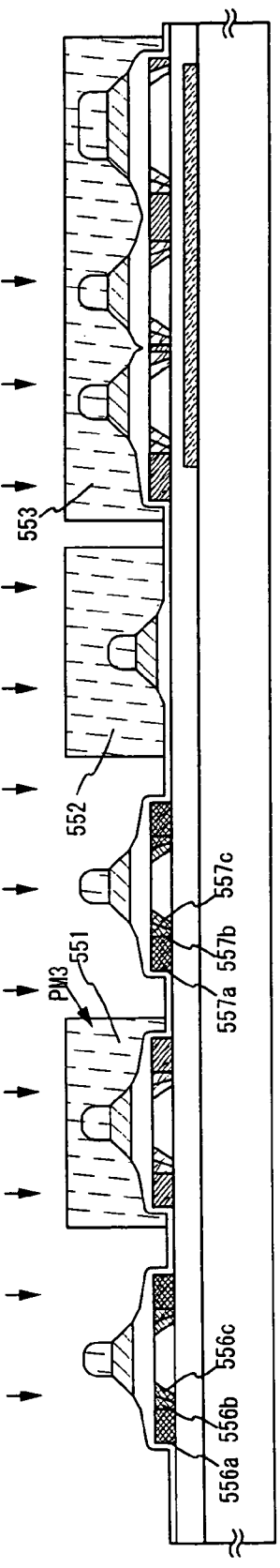

Next, a second etching treatment is conducted as shown in FIG. 10B. Similar to the first etching treatment, an ICP etching apparatus is employed, $CF_4$ and $Cl_2$ are mixed as an etching gas, the RF power is set to 3.2 W/cm² (13.56 MHz), the bias power is set to 45 mW/cm² (13.56 MHz), and the pressure is set to 1Pa for the second etching treatment. The etching under these conditions forms conductive layers 540 to 545 having a second shape. The conductive layers are tapered around their edges so that the thickness of the conductive layers is gradually increased toward their centers from the edges. Compared with the first etching treatment, the bias power applied to the substrate side in the second etching treatment is lower and the ratio of isotropic etching is increased that much. As a result, the angle of the tapered portions is 30 to 60°. The masks 512 to 517 are etched and the edges thereof are scraped off to form masks 534 to 539. The gate insulating film 580 having the second shape is etched by about 40 nm from the surface to form a new gate insulating film 570 having a third shape.

Then doping of the impurity element imparting the n type conductivity is conducted with a reduced dose and at a higher acceleration voltage than in the first doping treatment. For instance, the acceleration voltage is set to 70 to 120 keV and the dose is set to $1 \times 10^{13}$ atoms/cm², so that the concentration of the impurity in the regions that overlap the conductive layers 540 to 545 having the second shape reaches $1 \times 10^{16}$ to $1 \times 10^{18}$ atoms/cm³. Second impurity regions (B) 546 to 550 are thus formed.

Impurity regions 556 and 557 having a conductivity type opposite to the one conductivity type are formed in the semiconductor layers 505 and 507 for forming p-channel TFTs, respectively. Also in this case, the conductive layers 540 and 542 having the second shape are used as masks and the semiconductor layers are doped with an impurity element imparting the p type conductivity to form the impurity regions in a self-aligning manner. At this point, the semiconductor layers 506 and 508 for forming n-channel TFTs are completely covered with resist masks 551 to 553 that are formed by using a third photo mask (PM3). The impurity regions 556 and 557 are formed by ion doping using dibolane ($B_2H_6$). The concentration of the impurity element for imparting the p type conductivity in the impurity regions 556 and 557 is set to $2\times10^{20}$ to $2\times10^{21}$ atoms/cm$^3$.

Close look at the impurity regions 556 and 557 reveals that each of them can be divided into three regions that contain the impurity element imparting the n type conductivity. Third impurity regions 556a and 557a contain the impurity element imparting the n type conductivity in a concentration of $1\times10^{20}$ to $1\times10^{21}$ atoms/cm$^3$. Fourth impurity regions (A) 556b and 557b contain the impurity element imparting the n type conductivity in a concentration of $1\times10^{17}$ to $1\times10^{20}$ atoms/cm$^3$. Fourth impurity regions (B) 556c and 557c contain the impurity element imparting the n type conductivity in a concentration of $1\times10^{16}$ to $5\times10^{18}$ atoms/cm$^3$. However, the third impurity regions 556a and 557a have no problem in functioning as a source region and a drain region of the p-channel TFTs if the concentration of the impurity element for imparting the p type conductivity is 1.5 to 3 times the concentration of the impurity element for imparting the n type conductivity in the third impurity regions, and if the concentration of the impurity element for imparting the p type conductivity is $1\times10^{19}$ atoms/cm$^3$ or more in the impurity regions 556b, 556c, 557b and 557c. The fourth impurity regions (B) 556c and 557c are formed so as to partially overlap the conductive layers 540 and 542 having the second tapered shape, respectively.

Figure 11A:
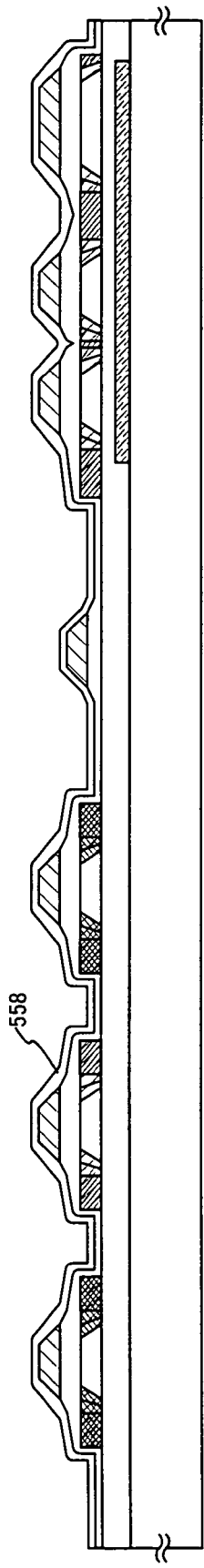
FIGS. 11A and 11B are diagrams showing the process of manufacturing the liquid crystal display according to the present invention.

Thereafter, as shown in FIG. 11A, a first interlayer insulating film 558 is formed on the conductive layers 540 to 545 having the second shape and the gate insulating film 570. The first interlayer insulating film 558 is a silicon oxide film, a silicon oxynitride film, a silicon nitride film, or a laminate film obtained by combining these films. In any case, the first interlayer insulating film 558 is formed from an inorganic insulating material. The thickness of the first interlayer insulating film 558 is set to 100 to 200 nm. When a silicon oxide film is used as the first interlayer is insulating film 558, the film is formed by plasma CVD while mixing TEOS with $O_2$ and discharging at a reaction pressure of 40 Pa, a substrate temperature of 300 to 400° C., and a high frequency (13.56 MHz) power density of 0.5 to 0.8 W/cm$^2$. When the first interlayer insulating film 558 is a silicon oxynitride film, a silicon oxynitride film formed by plasma CVD from $SiH_4$, $N_2O$ and $NH_3$ or a silicon oxynitride film formed by plasma CVD from $SiH_4$ and $N_2O$ can be used. According to the conditions for forming the film in this case, the reaction pressure is set to 20 to 200 Pa, the substrate temperature is set to 300 to 400° C., and the high frequency (60 MHz) power density is set to 0.1 to 1.0 W/cm$^2$. A silicon oxynitride hydrogenated film formed of $SiH_4$, $N_2O$ and $H_2$ may also be used as the first interlayer insulating film 558. Similarly, a silicon nitride film can be formed by plasma CVD from $SiH_4$ and $NH_3$.

The next step is to activate the impurity element imparting the n type conductivity and the impurity element imparting the p type conductivity which are contained in the respective concentrations. This step employs thermal annealing using an annealing furnace. Other usable methods include laser annealing and rapid thermal annealing (RTA). The thermal annealing is conducted in nitrogen atmosphere with the oxygen concentration being 1 ppm or less, preferably, 0.1 ppm or less, at a temperature of 400 to 700° C., typically, 500 to 600° C. In this embodiment, the heat treatment is given at 550° C. for four hours. If the substrate 501 is a plastic substrate having a low heat resistance, laser annealing is preferred.

Subsequent to the activation step, the atmosphere gas is changed to one containing 3 to 100% hydrogen and another heat treatment is conducted at 300 to 450° C. for one to twelve hours to hydrogenate the semiconductor layers. This step is to terminate $10^{16}$ to $10^{18}$ dangling bonds per centimeter cube of the semiconductor layers by thermally excited hydrogen. Other hydrogenation measures include plasma hydrogenation (that utilizes hydrogen excited by plasma). In either case, the defect density in the semiconductor layers 505 to 508 is desirably reduced to $10^{16}$ per centimeter cube or less and hence hydrogen on the order of 0.01 to 0.1 atomic % is given to the layers.

A second interlayer insulating film 559 is then formed from an organic insulating material so as to have a mean thickness of 1.0 to 2.0 µm. Organic resin materials such as polyimide, acrylic resin, polyamide, polyimideamide and BCB (benzocyclobutene) can be used. If polyimide of the type that is thermally polymerized after being applied to the substrate is used, for example, the film is formed by baking it in a clean oven at 300° C. When an acrylic resin is used, a two-pack type acrylic resin is chosen. Its main material and the curing agent are mixed and the mixture is applied to the entire surface of the substrate by using a spinner. The substrate is then preheated by a hot plate at 80° C. for 60 seconds before baked in a clean oven at 250° C. for 60 minutes to form the second interlayer insulating film.

With the second interlayer insulating film 559 thus formed from an organic insulating material, the surface can be leveled satisfactorily. Organic resin materials are generally low in dielectric constant, and hence the paracitic capacitance can be reduced. However, the organic resin materials are hygroscopic and inappropriate as a protective film. Therefore, the second interlayer insulating film formed of an organic resin material should be used in combination with a silicon oxide film, a silicon oxynitride film or a silicon nitride film of the first interlayer insulating film 558 as in this embodiment.

Thereafter, a resist mask having a given pattern is formed using a fourth photo mask (PM4) to form contact holes reaching the impurity regions that serve as source regions or drain regions in the respective semiconductor layers. The contact holes are formed by dry etching. In this case, a mixture of $CF_4$, $O_2$ and He is used as an etching gas to etch the second interlayer insulating film 559 formed of an organic resin material first. Subsequently, $CF_4$ and $O_2$ are mixed and used as an etching gas to etch the first interlayer insulating film 558. Further etching is performed on the gate insulating film 570 having the third shape after changing the etching gas into $CHF_3$, in order to enhance the selectivity ratio with respect to the semiconductor layers. Thus the contact holes are formed.

Then a conductive metal film is formed by sputtering or vacuum evaporation, and a resist mask pattern is formed using a fifth photo mask (PM5) to form source wirings 560 to 564 and drain wirings 565 to 568 by etching. A pixel electrode 569 is formed as the drain wirings are formed. A pixel electrode 571 is a pixel electrode belonging to the adjacent pixel. Though not shown, the wirings in this embodiment are formed as follows. A Ti film with a thickness of 50 to 150 nm is formed, contact portions are formed to obtain contact with the impurity regions for forming the source regions and drain regions in the semiconductor layers, an aluminum (Al) film with a thickness of 300 to 400 nm is formed on top of the Ti film, and a transparent conductive film is further formed thereon to have a thickness of 80 to 120 nm. Materials suitable for the transparent conductive film include an alloy of indium oxide and zinc oxide ($In_2O_3$—ZnO) and zinc oxide (ZnO). Zinc oxide added with gallium (Ga) (ZnO:Ga) or the like in order to increase the transmittance of visible light and conductivity is also a suitable material.

In this way, the TFTs for the driver circuits (the source signal line driver circuit and the gate signal line driver circuit) and the pixel TFT for the pixel portion can be formed on the same substrate with the use of five photo masks. In the driver circuits, a first p-channel TFT 600, a first n-channel TFT 601, a second p-channel TFT 602 and a second n-channel TFT 603 are formed whereas a pixel TFT 604 and a capacitor storage 605 are formed in the pixel portion.

In the first p-channel TFT 600, the conductive layer having the second tapered shape functions as a gate electrode 620, and the semiconductor layer 505 includes: a channel formation region 606; a third impurity region 607*a* functioning as a source region or a drain region; a fourth impurity region (A) 607*b* for forming an LDD region that does not overlap the gate electrode 620; and a fourth impurity region (B) 607*c* for forming an LDD region that partially overlaps the gate electrode 620.

In the first n-channel TFT 601, the conductive layer having the second tapered shape functions as a gate electrode 621, and the semiconductor layer 506 includes: a channel formation region 608; a first impurity region 609*a* functioning as a source region or a drain region; a second impurity region (A) 609*b* for forming an LDD region that does not overlap the gate electrode 621; and a second impurity region (B) 609*c* for forming an LDD region that partially overlaps the gate electrode 621. With respect to the channel length that is 2 to 7 μm, the length of the portion of the second impurity region (B) 609*c* where it overlaps the gate electrode 621 is 0.1 to 0.3 μm. The length of this Lov is controlled by controlling the thickness of the gate electrode 621 and the angle of the tapered portion. When such an LDD region is formed in an n-channel TFT, high electric field generated in the vicinity of the drain region can be eased, and hot carrier as well as TFT degradation can be prevented from taking place.

In the second p-channel TFT 602 of the driver circuits, the conductive layer having the second tapered shape functions as a gate electrode 622, and the semiconductor layer 507 includes: a channel formation region 610; a third impurity region 611*a* functioning as a source region or a drain region; a fourth impurity region (A) 611*b* for forming an LDD region that does not overlap the gate electrode 622; and a fourth impurity region (B) 611*c* for forming an LDD region that partially overlaps the gate electrode 622.

Figure 11B:
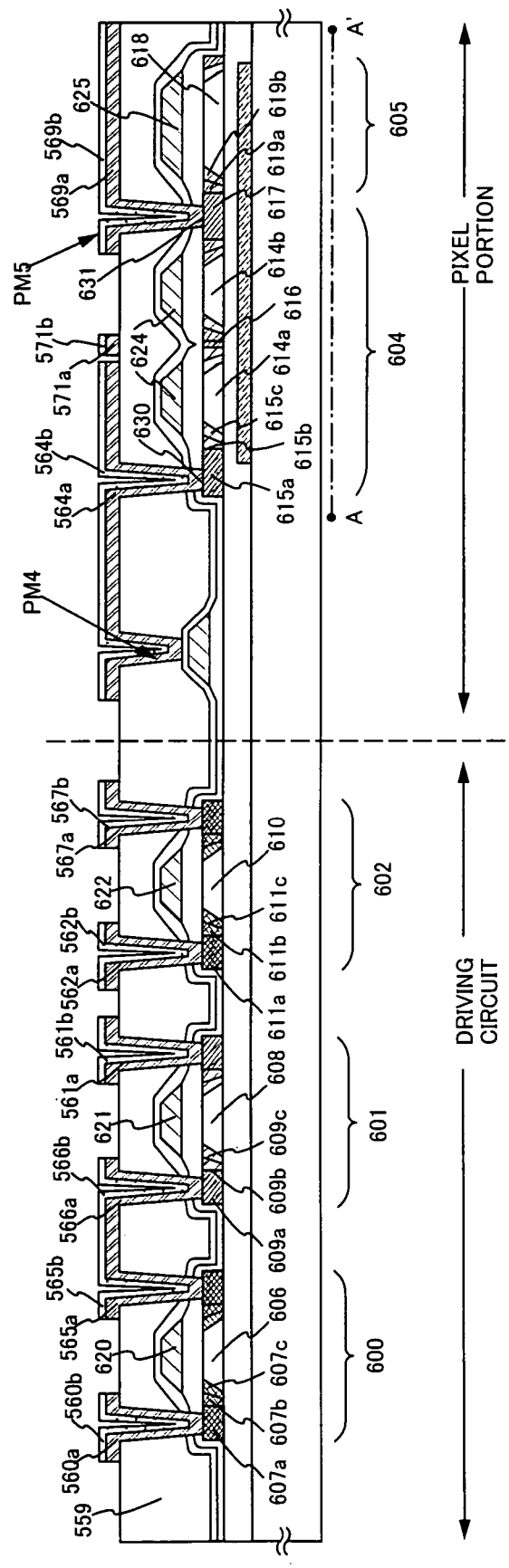

The driver circuits includes logic circuits such as a shift register and a buffer, and a sampling circuit comprised of an analog switch. In FIG. 11B, the TFTs constituting these circuits have a single gate structure in which one gate electrode is provided between a source and a drain forming a pair. However, the TFTs may take a multi-gate structure in which a plurality of electrodes are provided between a source and a drain forming a pair.

In the pixel TFT 604, the conductive layer having the second tapered shape functions as a gate electrode 624, and the semiconductor layer 508 includes: channel formation regions 614*a* and 614*b*; first impurity regions 615*a* and 617 functioning as a source region or a drain region; a second impurity region (A) 615*b* for forming an LDD region that does not overlap the gate electrode 624; and a second impurity region (B) 615*c* for forming an LDD region that partially overlaps the gate electrode 624. The length of the portion of the second impurity region (B) 615*c* where it overlaps the gate electrode 624 is 0.1 to 0.3 μm. The capacitor storage 605 comprises: the first impurity region 617; a second impurity region (A) 619*b*; a second impurity region (B) 619*c*; a semiconductor layer having a region 618 that is not doped with an impurity element determining the conductivity type of the region; an insulating layer of the same layer as the gate insulating film having the third shape; and an upper layer capacitance wiring 625 formed of the conductive layer having the second tapered shape.

The conductive layer 537 having the second tapered shape functions as a source signal line and is connected to the source region 615*c* of the pixel TFT 604 through the source wiring 564.

The channel formation regions 614*a* and 614*b* of the pixel TFT 604 are completely covered with the shielding film 502.

The gate electrode 624 of the pixel TFT 604 intersects through the gate insulating film 570 the underlying semiconductor layer 508, and further extends across the plural semiconductor layers to serve as the gate signal line. The capacitor storage 605 comprises a region where the semiconductor layer extended from the drain region 617 of the pixel TFT 604 overlaps the upper layer capacitance wiring 625 through the gate insulating film 570. In this structure, the semiconductor layer 618 as a capacitance wiring is not doped with an impurity element for controlling electrons.

The structure described above makes it possible to separately optimize the structure of the TFTs that constitute the pixel TFTs and the driver circuits in accordance with the specifications the respective components demand, thereby improving the operation performance and the reliability of the semiconductor device. Furthermore, activation of the LDD regions, the source regions and the drain regions is facilitated by forming the gate electrodes from a heat resistant conductive material. Moreover, the LDD regions overlapping the gate electrodes through the gate insulating films are doped with impurity elements for controlling the conductivity type in graduated concentrations, whereby the effect of alleviating electric field, especially in the vicinity of the drain region, can be improved.

Regarding the gate electrode structure of the TFTs, an operator may choose a suitable one out of the single gate structure and the multi-gate structure in which a plurality of gate electrodes are provided between a source and a drain forming a pair, in accordance with the characteristic of the circuit.

Figure 12A:
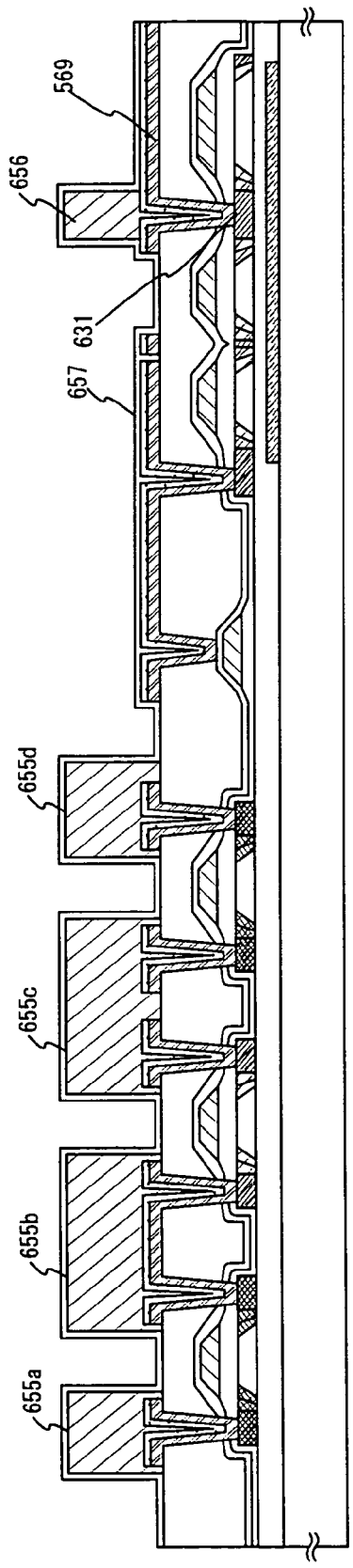
FIGS. 12A and 12B are diagrams showing the process of manufacturing the liquid crystal display according to the present invention.

Next, as shown in FIG. 12A, pillar-like spacers are formed on the active matrix substrate in the state of FIG. 11B. Although the spacers may be provided by spraying particles with a diameter of several μm, the method employed here is to form a resin film over the entire substrate and then pattern the film. The material of the spacers is not limited. For example, the NN 700, a product of JSR, is applied by a spinner and then exposure and development are conducted to form it into a given pattern. Then it is heated at 150 to 200° C. to cure by using a clean oven or the like. The spacers thus formed can have varying shapes depending on the conditions for exposure and development. A preferred shape for the spacers is a flat-top pillar, because this shape ensures the mechanical strength as a liquid crystal panel when the active matrix substrate is bonded with the opposite substrate. The spacers may also have a conical shape or a pyramidal shape. For example, specific dimensions for the spacers when they are conical are as follows. The height is set to 1.2 to 1.5 μm, the mean radius is set to 5 to 7 μm, and the ratio between the mean radius and the bottom radius is set to 1 to 1.5. At this point, the taper angle of the sides of the spacers is within ±15°.

The arrangement of the spacers may be determined arbitrarily. However, a preferred arrangement is as shown in FIG. 12A. In the pixel portion, a pillar-like spacer 656 is formed so as to overlap and cover a contact portion 631 of the pixel electrode 569. The evenness is impaired at the contact portion 631 to disturb the orientation of the liquid crystal at the point, but the discrimination or the like can be prevented when the pillar-like spacer 656 is formed by filling a spacer resin into the contact portion 631 as above. The TFTs for the driver circuits also have the spacers and spacers 655a to 655d are formed on the TFTs. These spacers may be formed all over the driver circuits, or may be formed so as to cover source wirings and drain wirings as shown in FIG. 12A.

An oriented film 657 is then formed. Polyimide resin is usually used for the is oriented film of a liquid crystal display element. After forming the oriented film it is subjected to rubbing treatment so that liquid crystal molecules are oriented with a certain pre-tilt angle. A region that is not rubbed stretches for 2 μm or less toward the rubbing direction from the edge of the pillar-like spacer 656 provided in the pixel portion. The spacers 655a to 655d formed on the TFTs for the driver circuits can protect the TFTs from static electricity, which often raises a problem during rubbing treatment. Though not shown, the spacer 656 and the spacers 655a to 655d may be formed after the oriented film 657 is formed.

Figure 12B:
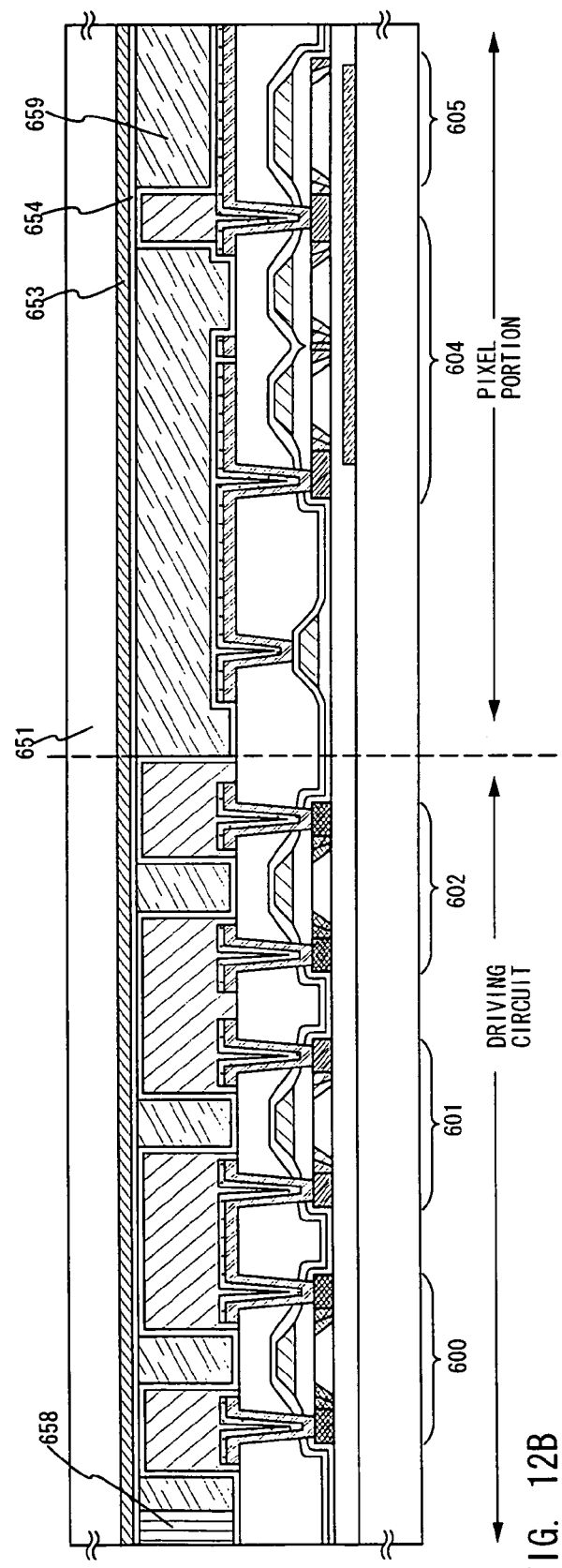

An opposite substrate 651 on the opposite side has a transparent conductive film 653 and an oriented film 654 formed thereon. Using a sealing agent 658, the opposite substrate is bonded to the active matrix substrate on which the pixel portion and the driver circuits are formed. The sealing agent 658 is mixed with a filler (not shown), which, together with the spacer 656 and the spacers 655a to 655d, keeps a uniform distance between the two substrates when they are bonded to each other. Thereafter, a liquid crystal material 659 is injected between the two substrates. A known liquid crystal material can be used. Examples of usable liquid crystal materials include TN liquid crystals and thresholdless antiferroelectric mixed liquid crystals, which have an electro-optical response characteristic where the transmittance is continuously changed in response to the electric field. Among the thresholdless antiferroelectric mixed liquid crystals, there is one that displays an electro-optical response characteristic forming a letter V when it is graphed. In this way, an active matrix liquid crystal display shown in FIG. 12B is completed.

The present invention is not limited to the manufacturing method described in this embodiment. It is also possible to manufacture the active matrix liquid crystal display of the present invention by using a known method.

This embodiment can be combined freely with Embodiment 3.

[Embodiment 5]

This embodiment gives a description with reference to FIGS. 16A to 18B on an example of the method of manufacturing the liquid crystal display according to the present invention.

Referring to FIG. 16A, a substrate 800 is prepared first. The substrate 800 in this embodiment is made of glass such as barium borosilicate glass represented by the Corning 7059 glass or the Corning 1737 glass that are products of Corning Incorporated, or alumino borosilicate glass. The material of the substrate 800 is not limited as long as it is a light transmissive substrate, and a quartz substrate may be used. Alternatively, a plastic substrate may be used if it has a heat resistance that can endure the treatment temperature in this embodiment.

A shielding film 801 is formed on a surface of the substrate 800 where TFTs are to be formed. The shielding film 801 is formed by depositing W to a thickness of 0.1 μm to 0.5 μm (0.2 μm, in this embodiment), which is then etched by ICP (Inductively Coupled Plasma) etching. In the etching, an etching gas obtained by mixing $CF_4$ and $Cl_2$ is used and an RF (13.56 MHz) power of 500 W is given to a coil-formed electrode at a pressure of 1Pa to generate plasma. The substrate side (sample stage) also receives an RF (13.56 MHz) power of 100 W so that a substantially negative self-bias voltage is applied.

W is used in this embodiment to form the shielding film 801. However, the present invention is not limited thereto. Materials that can be used other than W include metals such as WSix, Cu and Al, and silicon, silicon oxide and silicon oxynitride that are mixed with a black pigment. Other than the materials mentioned above, any material can be used as long as it is capable of shielding against light and enduring the treatment temperature in a later step along the process.

Next, an insulating film is formed from silicon oxide on the substrate 800 so as to cover the shielding film 801. The insulating film may be a silicon nitride film or a silicon oxynitride film instead of the silicon oxide film. For example, it may be a laminate of a silicon oxynitride film formed by plasma CVD from $SiH_4$, $NH_3$ and $N_2O$ to a thickness of 250 to 800 nm (preferably 300 to 500 nm) and a silicon oxynitride hydrogenated film similarly formed from $SiH_4$ and $N_2O$ to a thickness of 250 to 800 nm (preferably 300 to 500 nm). The insulating film here uses silicon oxide and is formed into a single layer having a thickness of 0.5 to 1.5 μm. The material of the insulating film is not limited to silicon oxide.

The insulating film is then polished by CMP to form a planarization insulating film 802. A known CMP technique can be used here. Slurry generally used in polishing an oxide film is a solid-liquid dispersion system slurry obtained by dispersing a 100 to 1000 nmΦ abrasive in a solution containing a reagent such as a pH adjuster. This embodiment uses a silica slurry (pH=10 to 11) in which 20 wt % of fumed silica particles obtained by pyrolizing silicon chloride gas are dispersed in a solution added with potassium hydroxide.

After forming the polarization insulating film 802, semiconductor layers 803 to 806 are formed on the planarization insulating film 802. The semiconductor layers 803 to 806 are obtained by forming a semiconductor film having an amorphous structure through a known method (sputtering, LPCVD or plasma CVD), crystallizing the amorphous semiconductor film through a known crystallization processing (laser crystallization, thermal crystallization, or thermal crystallization that uses a catalyst such as nickel), and patterning the obtained crystalline semiconductor film into a desired shape. The semiconductor layers 803 to 806 each has a thickness of 25 to 80 nm (preferably 30 to 60 nm). No limitation is put on the material of the crystalline semiconductor film but silicon, a silicon germanium alloy ($Si_xGe_{1-x}$ (X=0.0001 to 0.02)), or the like is preferable. In this embodiment, an amorphous silicon film is formed by plasma CVD to a thickness of 55 nm and a solution containing nickel is then retained on the amorphous silicon film. Dehydrogenation (at 500° C. for an hour) is performed on the amorphous silicon film before thermal crystallization (at 550° C. for four hours) is conducted. Then the film is subjected to laser annealing for improving the crystallinity to obtain the crystalline silicon film. The crystalline silicon film is patterned by using photolithography to form the semiconductor layers 803 to 806.

The semiconductor layers 803 to 806 then may be doped with a minute amount of impurity element (boron or phosphorus) for controlling the threshold of the TFTs.

When laser crystallization is chosen to form the crystalline semiconductor film, a pulse oscillation or continuous wave excimer laser, YAG laser or YVO$_4$ laser can be used. In using such laser, laser light emitted from a laser oscillator is preferably collected by an optical system into a linear beam before irradiating the semiconductor film. Conditions for the crystallization may suitably be chosen by an operator. However, appropriate conditions in the case of using an excimer laser include setting the pulse oscillation frequency to 300 Hz and setting the laser energy density to 100 to 400 mJ/cm$^2$ (typically 350 to 500 mJ/cm$^2$). If the laser is an YAG laser, its second harmonic is used to set the pulse oscillation frequency to 30 to 300 kHz and the laser energy density is appropriately set to 300 to 600 mJ/cm$^2$ (typically 200 to 300 mJ/cm$^2$). The laser light is then collected into a linear beam with a width of 100 to 1000 μm, for example, 400 μm, and the substrate is irradiated with the linear beam until the laser scanning covers the entire surface of the substrate. The overlap ratio of the linear laser light beams in this case is 50 to 98%.

A gate insulating film 807 is formed next to cover the semiconductor layers 803 to 806. The gate insulating film 807 is formed by plasma CVD or sputtering from an insulating film containing silicon to a thickness of 40 to 150 nm. In this embodiment, silicon oxynitride film (composition ratio:Si=32%, O=59%, N=7%, H=2%) with a thickness of 110 nm is formed by plasma CVD. The gate insulating film is not limited to a silicon oxynitride film, of course, but a single layer or a laminate layer of other silicon-containing films can be used as the gate insulating film.

When a silicon oxide film is used, the film is formed by plasma CVD while mixing TEOS (tetraethyl orthosilicate) with O$_2$, and discharging at a reaction pressure of 40 Pa, a substrate temperature of 300 to 400° C., and a high frequency (13.56 MHz) power density of 0.5 to 0.8 W/cm$^2$. The silicon oxide film thus formed displays excellent characteristics as the gate insulating film through a subsequent thermal annealing at 400 to 500° C.

Next, as shown in FIG. 16A, a first conductive film 808a with a thickness of 20 to 100 nm and a second conductive film 808b with a thickness of 100 to 400 nm are layered on the gate insulating film 807. In this embodiment, the first conductive film 808a is a 30 nm thick TaN film, on which a W film having a thickness of 370 nm and serving as the second conductive film 808b is placed to form a laminate. The TaN film is formed by sputtering with Ta as the target in atmosphere containing nitrogen. The W film is formed by sputtering with W as the target. Alternatively, the W film may be formed by thermal CVD using tungsten hexafluoride (WF$_6$). In either case, the film has to be lowered in resistivity in order to use it as the gate electrode, and the resistivity of the W film is desirably 20 μΩcm or lower. The resistivity of the W film can be lowered when the grain size in the film is increased. However, if there are many impurity elements such as oxygen in the W film, crystallization is hindered and the resistivity is increased. For that reason, the W film in this embodiment is formed by sputtering while using a high purity W target (purity:99.9999%) and taking a great care to avoid mixing-in of impurities from the air during the film formation. As a result, the W film can have a reduced resistivity of 9 to 20 μΩcm.

The first conductive film 808a and the second conductive film 808b in this embodiment are formed from TaN and W, respectively, but the materials thereof are not particularly limited. Each of them can be formed of an element selected from the group consisting of Ta, W, Ti, Mo, Al, Cu, Cr and Nd, or of an alloy material or compound material mainly containing one or more of the elements above. A semiconductor film, typically a polycrystalline silicon film, doped with an impurity element such as phosphorus may also be used. An AgPdCu alloy is also included in the usable materials. The following combinations of the fist conductive film and the second coductive film are also suitable; a tantalum (Ta) film for the first conductive film and a W film for the second conductive film, a titanium nitride (TiN) film for the first conductive film and a W film for the second conductive film, a tantalum nitride (TaN) film for the first conductive film and an Al film for the second conductive film, and a tantalum nitride (TaN) film for the first conductive film and a Cu film for the second conductive film.

A resist mask 809 is next formed by photolithography to carry out a first etching treatment for forming electrodes and wirings (FIG. 16B). The first etching treatment employs first etching conditions and second etching conditions. In this embodiment, the first etching conditions include: using ICP (Inductively Coupled Plasma) etching; using as an etching gas CF$_4$, Cl$_2$ and O$_2$ and setting the ratio of their respective flow rates to 25/25/10 (sccm); and giving an RF (13.56 MHz) power of 500 W to a coil-formed electrode at a pressure of 1Pa to generate plasma. Used here is a dry etching apparatus adopting ICP (model: E645-□ICP), a product of Matsushita Electric Industrial Co., Ltd. The substrate side (sample stage) also receives an RF (13.56 MHz) power of 150 W so that a substantially negative self-bias voltage is applied. The W film is etched under the first etching conditions, so that the first conductive layer is tapered around the edge. The etching rate for etching the W film under the first etching conditions is 200.39 nm/min., whereas the etching rate for etching the TaN film under the first etching conditions is 80.32 nm/min. Accordingly the selective ratio of W to TaN is about 2.5. The taper angle of the W film is about 26° under the first etching conditions.

Thereafter, the first etching conditions are switched to the second etching conditions as the resist mask 809 is remained in its place. The second etching conditions include: using as an etching gas CF$_4$ and Cl$_2$ and setting the ratio of their respective flow rates to 30/30 (sccm); and giving an RF (13.56 MHz) power of 500 W to a coil-formed electrode at a pressure of 1Pa to generate plasma. This time etching takes about 30 seconds. The substrate side (sample stage) also receives an RF (13.56 MHz) power of 20 W so that a substantially negative self-bias voltage is applied. Under the second etching conditions in which a mixture of CF$_4$ and Cl$_2$ is used for the etching gas, the W film and the TaN film are etched to about the same extent. The etching rate for etching the W film under the second etching conditions is 58.97 nm/min., whereas the etching rate for etching the TaN film under the second etching conditions is 66.43 nm/min. In order to achieve etching free of residue, it is appropriate to prolong the etching time by about 10 to 20%.

In the first etching treatment above, the first conductive layer and the second conductive layer are tapered around their edges owing to a proper shape of the resist mask 809 and the effect of the bias voltage applied to the substrate side. The angle of the tapered portions is appropriately 15 to 45°. Thus formed through the first etching treatment are conductive layers 810 to 813 having a first shape (first conductive layers 810a to 813a and second conductive layers 810b to 813b) which are formed from the first conductive layer and the second conductive layer. Reference symbol 814 denotes a gate insulating film, and regions of the gate insulating film which are not covered with the conductive layers 810 to 813 having the first shape are etched by about 20 to 50 nm, thereby forming thinned regions.

Without removing the resist mask, a second etching treatment is conducted next (FIG. 16C). In the etching here, an etching gas obtained by mixing $CF_4$, $Cl_2$ and $O_2$ is used, ratio of their respective flow rates is set to 25/25/10 (sccm), and an RF (13.56 MHz) power of 500 W is given to a coil-formed electrode at a pressure of 1Pa to generate plasma. The substrate side (sample stage) also receives an RF (13.56 MHz) power of 20 W so that a substantially negative self-bias voltage is applied. The etching rate for etching the W film in the second etching treatment is 124.62 nm/min., whereas the etching rate for etching the TaN film in the second etching treatment is 20.67 nm/min., and the selective ratio of W to TaN is 6.05. Accordingly, the W film is selectively etched. The taper angle of the W film is 70° after receiving the second etching treatment. Through the second etching treatment, second conductive layers 816b to 819b are formed. On the other hand, the first conductive layers 810a to 813a are barely etched to form first conductive layers 816a to 819a. Denoted by 820 is a gate insulating film, and regions of the gate insulating film which are not covered with the conductive layers 816 to 819 having the first shape are etched by about 20 to 50 nm, thereby forming thinned regions.

The first conductive layer 816a and the second conductive layer 816b together form an electrode, which serves as a gate electrode of an n-channel TFT for a driver circuit to be formed in a later step. The first conductive layer 817a and the second conductive layer 817b together form an electrode, which serves as a gate electrode of a p-channel TFT for the driver circuit to be formed in a later step. Similarly, the first conductive layer 818a and the second conductive layer 818b together form an electrode, which serves as a gate electrode of an n-channel TFT for a pixel portion to be formed in a later step. The first conductive layer 819a and the second conductive layer 819b together form an electrode, which serves as one of electrodes of a capacitor storage (capacitance wiring) in the pixel portion to be formed in a later step.

Figure 17A:
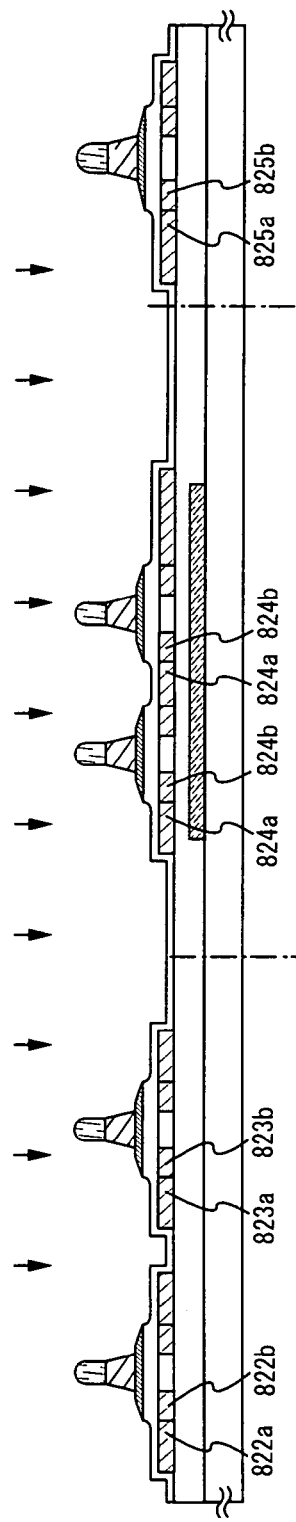
FIGS. 17A to 17C are diagrams showing the process of manufacturing the liquid crystal display according to the present invention.

A first doping treatment is performed next to obtain the state of FIG. 17A. In the doping, the second conductive layers 816b to 819b are used as masks against an impurity element and semiconductor layers below the tapered portions of the first conductive layers 816a to 819a are doped with the impurity element. This embodiment uses plasma doping while choosing phosphorus (P) for the impurity element, setting the dose to $3.5 \times 10^{12}$, and setting the acceleration voltage to 90 keV. Thus formed in a self-aligning manner are low concentration impurity regions 822a to 825a, which do not overlap the first conductive layers, and low concentration impurity regions 822b to 825b, which overlap the first conductive layers. The concentration of phosphorus (P) in the low concentration impurity regions 822b to 825b is $1 \times 10^{17}$ to $1 \times 10^{18}$ atoms/cm$^3$, and the concentration shows gentle gradient in accordance with the graduated thicknesses of the tapered portions of the first conductive layers 816a to 819a. In the semiconductor layers that overlap the tapered portions of the first conductive layers 816a to 819a, the concentration of the impurity element is slightly decreased toward the centers from the edges of the tapered portions of the first conductive layers 816a to 819a. However, overall, the concentration is almost uniform.

Figure 17B:
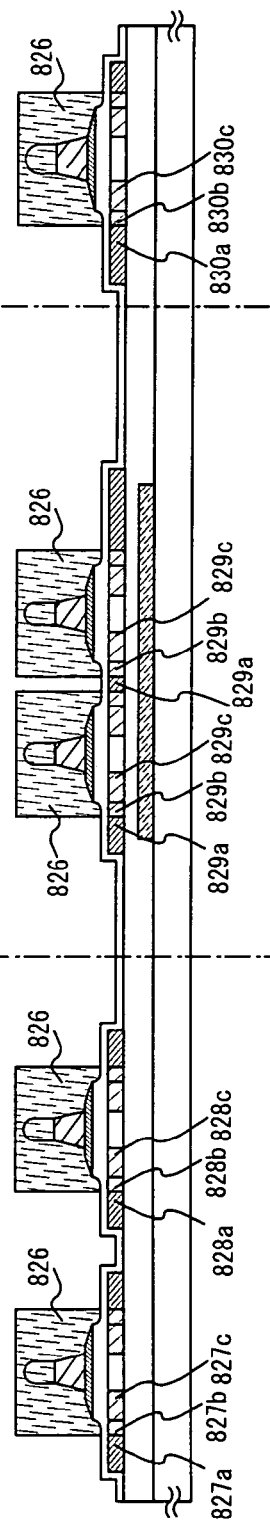

Then a resist mask 826 is formed to conduct a second doping treatment for doping the semiconductor layers with an impurity element imparting the n type conductivity (FIG. 17B). In this doping treatment, ion doping or ion implanting is employed. Conditions for ion doping include setting the dose to $1 \times 10^{13}$ to $5 \times 10^{15}$ atoms/cm$^2$ and setting the acceleration voltage to 60 to 100 keV. In this embodiment, the dose is set to $1.5 \times 10^{15}$ atoms/cm$^2$ and the acceleration voltage is set to 80 keV. The impurity element imparting n type conductivity is an element belonging to Group 15 in the periodic table, typically, phosphorus (P) or arsenic (As). Phosphorus (P) is used here. In this case, the conductive layers 816 to 819 serve as masks against the impurity element imparting the n type conductivity as high concentration impurity regions 827a to 830a, low concentration impurity regions 827b to 830b, which do not overlap the first conductive layers, and low concentration impurity regions 827c to 830c, which overlap the first conductive layers, are formed in a self-aligning manner. The high concentration impurity regions 827a to 830a are doped with the impurity element imparting the n type conductivity in a concentration of $1 \times 10^{20}$ to $1 \times 10^{21}$ atoms/cm$^3$.

The semiconductor films for forming the p-channel TFT do not need to be doped with the impurity element imparting the n type conductivity through the second doping treatment shown in FIG. 17B. Therefore the mask 826 is formed so as to cover the semiconductor layers 804 and 806 completely, thereby preventing the layers from being doped with the n type impurity element. The mask 826 may not be provided on the semiconductor layers 804 and 806. In this case, the polarity of these semiconductor layers is changed to p type in a third doping treatment.

Figure 17C:
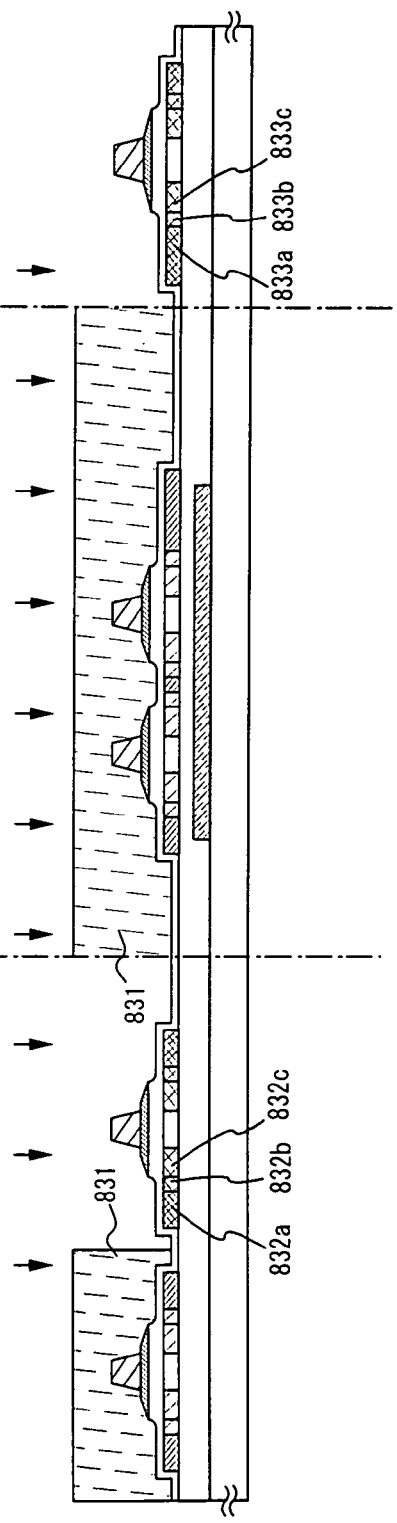

After removing the resist mask 826, a resist mask 831 is newly formed for the third doping treatment. Formed through the third doping treatment in the semiconductor layer that is to serve as an active layer of the p-channel TFT are impurity regions 832 and 833 doped with an impurity element imparting the conductivity type (p type) opposite to the conductivity type (n type) in the second doping treatment (FIG. 17C). The first conductive layers 817 and 819 are used as masks against the impurity element, and doping of the impurity element imparting the p type conductivity is carried out to form the impurity regions in a self-aligning manner. In this embodiment, the impurity regions 832 and 833 are formed by ion doping using dibolane ($B_2H_6$). The semiconductor layers for forming the n-channel TFTs are covered with the resist mask 831 during the third doping treatment. The impurity regions 832b and 832c have been doped with phosphorus in different concentrations through the first doping treatment and the second doping treatment. However, in the third doping treatment, the impurity regions 832b and 832c are both doped with the impurity element for imparting the p type conductivity in a concentration of $2 \times 10^{20}$ to $2 \times 10^{21}$ atoms/cm$^3$. Therefore the impurity regions 832b and 832c have no problem in functioning as a source region or a drain region of the p-channel TFT.

Through the above steps, the impurity regions are formed in the respective semiconductor layers.

The resist mask 831 is removed next to form a first interlayer insulating film 835. The first interlayer insulating film 835 is a silicon-containing insulating film formed by plasma CVD or sputtering to a thickness of 100 to 200 nm.

In this embodiment, a silicon oxynitride film with a thickness of 150 nm is formed by plasma CVD. The first interlayer insulating film 835 is not limited to a silicon oxynitride film, of course, but a single layer or a laminate layer of other silicon-containing films can be used as the first interlayer insulating film.

Figure 18A:
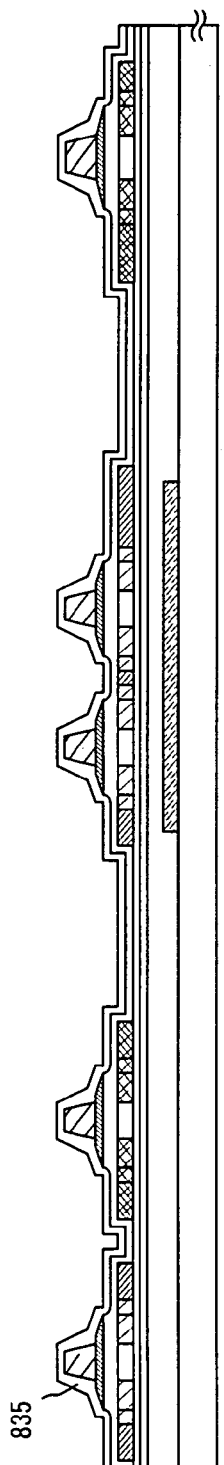
FIGS. 18A and 18B are diagrams showing the process of manufacturing the liquid crystal display according to the present invention.
Figure 18B:
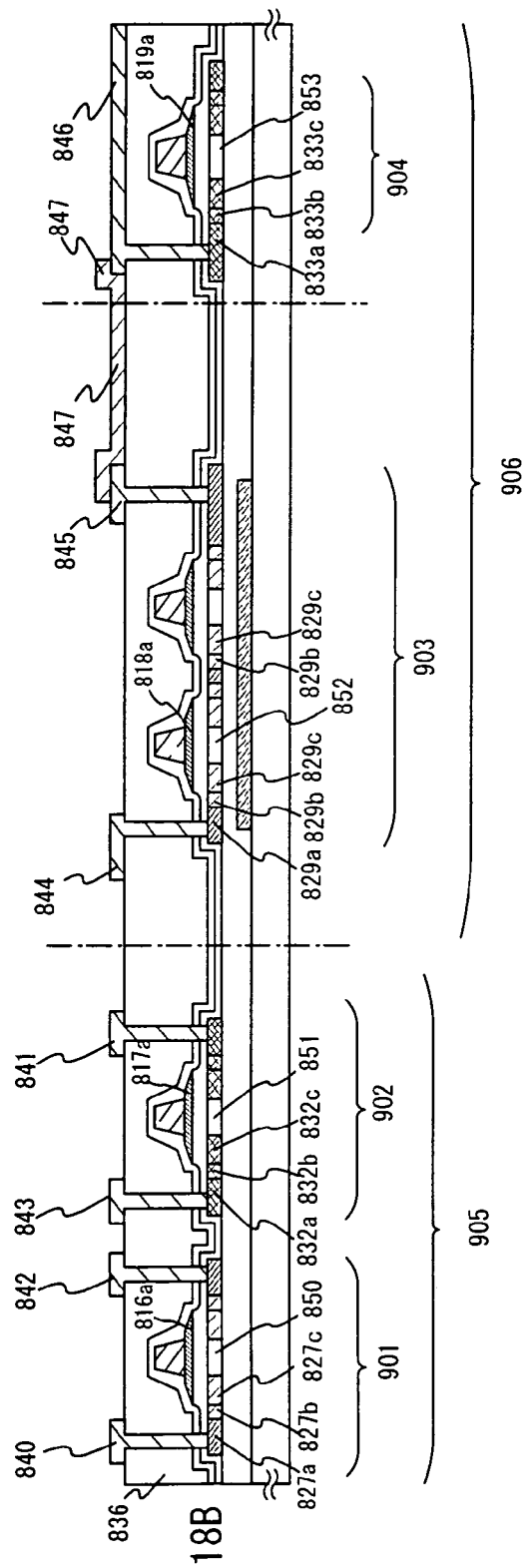

The next step is to activate the impurity elements used to dope the respective semiconductor layers as shown in FIG. 18A. This activation step employs thermal annealing using an annealing furnace. The thermal annealing is conducted in nitrogen atmosphere with the oxygen concentration being 1 ppm or less, preferably, 0.1 ppm or less, at a temperature of 400 to 700° C., typically, 500 to 550° C. In this embodiment, the activation is made by heat treatment at 550° C. for four hours. Other usable methods than thermal annealing include laser annealing and rapid thermal annealing (RTA).

In this embodiment, during the above activation, the nickel that has been used as the catalyst for crystallization is simultaneously moved by the gettering action to the impurity regions that contain a high concentration of phosphorus (regions 827a, 829a, 832a and 833a) to reduce the nickel concentration mainly in the semiconductor layers that are to serve as the channel formation regions. TFTs that have the channel formation regions thus formed are low in OFF current value and have excellent crystallinity to obtain high electric field mobility. Therefore the TFTs can attain excellent characteristics.

The activation may be carried out before the first interlayer insulating film 835 is formed. However, if the material used for the wiring is weak against heat, it is preferred to conduct activation after the interlayer insulating film (an insulating film containing silicon as main ingredient, e.g., a silicon nitride film) as in this embodiment in order to protect the wiring and others as well.

Another heat treatment is conducted in atmosphere containing 3 to 100% hydrogen at 300 to 550° C. for one to twelve hours to hydrogenate the semiconductor layers. In this embodiment, heat treatment is carried out in nitrogen atmosphere containing about 3% of hydrogen at 410° C. for an hour. This step is to terminate dangling bonds in the semiconductor layers by hydrogen contained in the interlayer insulating film. Other hydrogenation measures include plasma hydrogenation (that utilizes hydrogen excited by plasma).

If laser annealing is employed for the activation, irradiation of laser light such as an excimer laser or a YAG laser takes place desirably after the above hydrogenation.

Next, a second interlayer insulating film 836 is formed on the first interlayer insulating film 835 from an organic insulating material. An acrylic resin film with a thickness of 1.6 μm is formed in this embodiment. The film is then patterned to form contact holes reaching respective impurity regions 827a, 829a, 832a and 833a.

Subsequently, electrodes 840 to 843 each electrically connected to one of the impurity regions 827a and 832a are formed in a driver circuit 905. These electrodes are formed by patterning a laminate film of a Ti film with a thickness of 50 nm and an alloy film (Al-Ti alloy film) with a thickness of 500 nm.

In a pixel portion 906, a connection wiring 845, or a source signal line 844, that is in contact with the impurity region 829a is formed, and a connection wiring 846 that is in contact with the impurity region 833a is also formed.

A transparent conductive film with a thickness of 80 to 120 nm is then formed on the connection wirings and is patterned to form a pixel electrode 847. (FIG. 18B) Materials suitable for the transparent conductive film include an alloy of indium oxide and zinc oxide ($In_2O_3$—ZnO) and zinc oxide (ZnO). Zinc oxide added with gallium (Ga) (ZnO:Ga) in order to increase the transmittance of visible light and conductivity is also a suitable material.

By forming the pixel electrode 847 on the connection wiring 845 so that the electrode is brought into contact with the wiring, an electrical connection with a drain region of the pixel TFT is formed as well as an electrical connection with the semiconductor layer (impurity region 833a) that functions as one of the electrodes of the capacitor storage.

A transparent conductive film is used for the pixel electrode 847 in the example described here. On the other hand, when the pixel electrode is formed from a conductive material having reflectivity, a reflective liquid crystal display can be manufactured. In this case, the electrodes and the pixel electrode can be formed simultaneously. The desirable material for the pixel electrode of that case is a highly reflective material, such as a film containing Al or Ag as its main ingredient or a laminate film thereof.

In this way, the driver circuit 905 having an n-channel TFT 901 and a p-channel TFT 902 can be formed on the same substrate on which the pixel portion 906 having a pixel TFT 903 and a capacitor storage 904 is formed.

The n-channel TFT 901 of the driver circuit 905 includes: a channel formation region 850; the low concentration impurity region 827c (GOLD region) that overlaps the first conductive layer 816a constituting one of the gate electrodes; the low concentration impurity region 827b (LDD region) that is formed outside the gate electrode; and the high concentration impurity region 827a that functions as a source region or a drain region. The p-channel TFT 902 includes: a channel formation region 851; the impurity region 832c that overlaps the first conductive layer 817a constituting one of the gate electrodes; the impurity region 832b that is formed outside the gate electrode; and the impurity region 832a that functions as a source region or a drain region.

The pixel TFT 903 of the pixel portion 906 includes: a channel formation region 852; the low concentration impurity region 829c (GOLD region) that overlaps the first conductive layer 818a constituting one of the gate electrodes; the low concentration impurity region 829b (LDD region) that is formed outside the gate electrode; and the high concentration impurity region 829a that functions as a source region or a drain region. The semiconductor layers 833a to 833c, which are a part of the capacitance wiring serving as one of the electrodes of the capacitor storage 904, are doped with an impurity element imparting the p type conductivity. The capacitor storage 904 comprises the electrode 819, the semiconductor layers 833a to 833c and a semiconductor layer 853, with the gate insulating film 820 as a dielectric.

The shielding film 801 overlaps the entire channel formation region 852 of the pixel TFT 903.

An oriented film 855 is formed next and rubbing treatment is performed on the film. In this embodiment, before forming the oriented film 855, an organic resin film such as an acrylic resin film is patterned to form, at desired positions, pillar-like spacers for maintaining the distance between substrates. Instead of the pillar-like spacers, spherical spacers may be sprayed throughout the entire surface of the substrate.

Next, an opposite substrate 856 is prepared. The opposite substrate is provided with a color filter in which colored layers 858 are arranged in relation to pixels of the respective colors. A planarization film 859 is then formed to cover the color filter. On the planarization film 859, an opposite electrode 857 is formed in the pixel portion 906 from a transparent conductive film. An oriented film 860 is formed over the entire surface of the opposite substrate and rubbing treatment is performed on the film.

Figure 19:
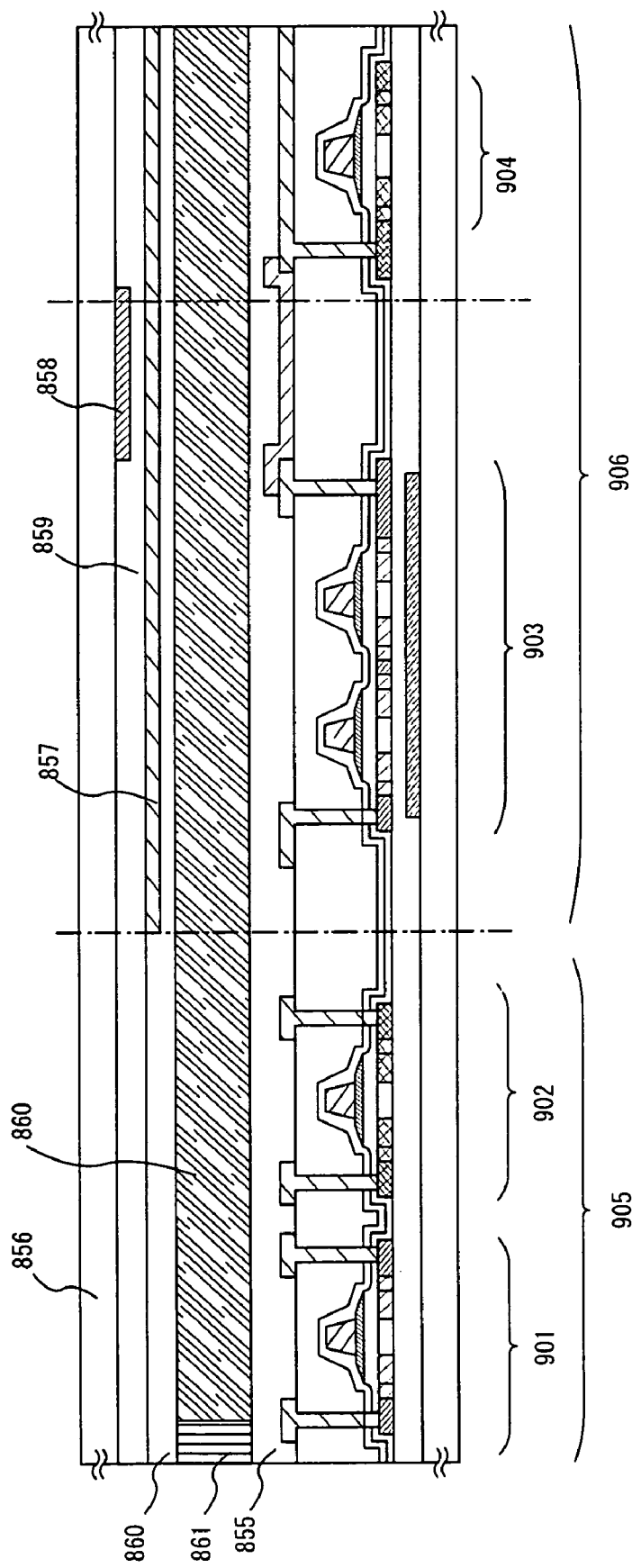
FIG. 19 is a diagram showing the process of manufacturing the liquid crystal display according to the present invention.

Using a sealing agent 861, the opposite substrate is bonded to the active matrix substrate on which the pixel portion 906 and the driver circuit 905 are formed. The sealing agent 861 is mixed with a filler, which, together with the pillar-like spacers, keeps a uniform distance between the two substrates when they are bonded to each other. Thereafter, a liquid crystal material 862 is injected between the two substrates and the device is completely sealed by an end-sealing material (not shown). The liquid crystal material 862 may be a known liquid crystal material. In this way, an active matrix liquid crystal display shown in FIG. 19 is completed. The active matrix substrate or the opposite substrate is cut into a desired shape if the need arises. A polarizing plate and the like may suitably provided by a known technique. An FPC is then bonded by using a known technique.

This embodiment can be carried out in combination with Embodiment 3.

[Embodiment 6]

This embodiment gives an example of a cross sectional view of a liquid crystal display having the structure of the present invention.

Figure 20:
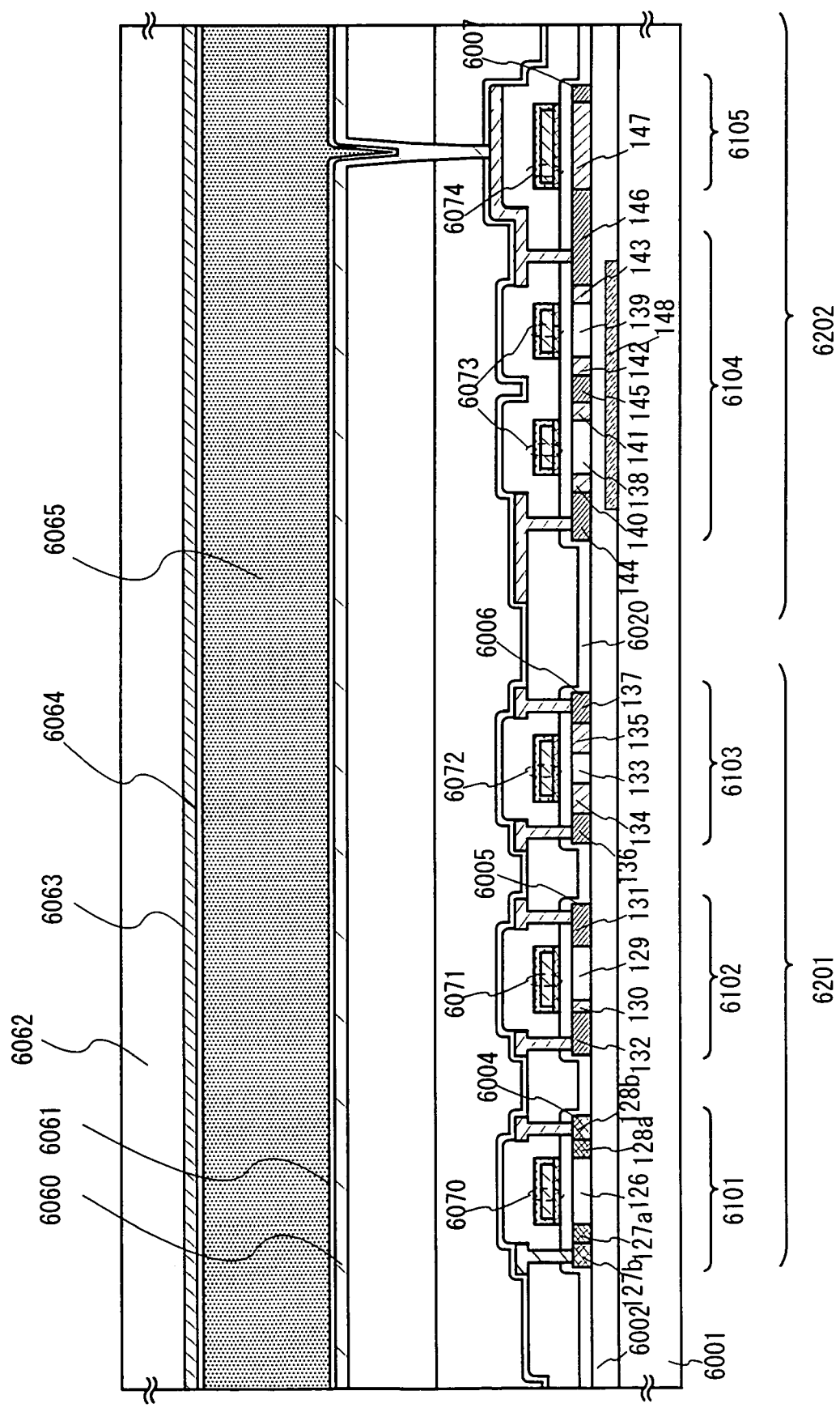
FIG. 20 is a sectional view of a liquid crystal display according to the present invention.

FIG. 20 shows a sectional view of the liquid crystal display having the structure of the present invention. A shielding film 148 containing silicon oxide and a black pigment is formed on an active matrix substrate 6001. A planarization insulating film 6002 is formed on the active matrix substrate 6001 so as to cover the shielding film 148.

On the planarization insulating film 6002, a p-channel TFT 6101, a first n-channel TFT 6102 and a second n-channel TFT 6103 are formed in a driver circuit 6201 whereas a pixel TFT 6104 and a capacitor storage 6105 are formed in a pixel portion.

The p-channel TFT 6101 of the driver circuit has, in a semiconductor layer 6004, a channel formation region 126, source regions 127*a* and 127*b*, and drain regions 128*a* and 128*b*. The first n-channel TFT 6102 has, in a semiconductor layer 6005, a channel formation region 129, an LDD region 130 that overlaps a gate electrode 6071 (an LDD region as such is referred to as Lov), a source region 131, and a drain region 132. The length of the Lov region in the channel length direction is set to 0.5 to 3.0 μm, preferably 1.0 to 1.5 μm. The second n-channel TFT 6103 has, in a semiconductor layer 6006, a channel formation region 133, LDD regions 134 and 135, a source region 136, and a drain region 137. These LDD regions include an Lov region and an LDD region that does not overlap a gate electrode 6072 (an LDD region as such is referred to as Loff). The length of the Loff region in the channel length direction is set to 0.3 to 2.0 μm, preferably 0.5 to 1.5 μm. The pixel TFT 6104 has, in a semiconductor layer 6007, channel formation regions 138 and 139, Loff regions 140 to 143, and source or drain regions 144 to 146. The length of each of the Loff regions in the channel length direction is set to 0.5 to 3.0 μm, preferably 1.5 to 2.5 μm. Offset regions (not shown) are formed between the channel formation regions of the pixel TFT 6104 and the Loff regions that are LDD regions of the pixel TFT (between 138 and 140, between 138 and 141, between 139 and 142, and between 139 and 143). The capacitor storage 6105 comprises: an upper layer capacitance wiring 6074; an insulating film that is a gate insulating film 6020; and a semiconductor layer 147 (capacitance wiring) that is connected with the drain region 146 of the pixel TFT 6104 and is doped with an impurity element imparting the n type conductivity. The pixel TFT 6104 has a double gate structure in FIG. 20. However, there is no inconvenience if the pixel TFT has a single gate structure or a multi-gate structure in which a plurality of gate electrodes are provided.

The shielding film 148 completely overlaps the channel formation regions 138 and 139 of the pixel TFT 6104.

The structure described above makes it possible to separately optimize the structure of the TFTs that constitute the pixel portion and the driver circuits in accordance with the specifications the respective components demand, thereby improving the operation performance and the reliability of the liquid crystal display.

Denoted by 6060 is a pixel electrode, which is electrically connected to the drain region 146 of the pixel TFT 6104. Reference symbol 6061 denotes an oriented film. 6062 denotes an opposite substrate, 6063, an opposite electrode, 6064, another oriented film, and 6065, a liquid crystal. The liquid crystal shown in FIG. 20 is a reflective liquid crystal display.

The reflective liquid crystal display in this embodiment displays an image in TN (twist) mode. Accordingly, a polarizing plate (not shown) is arranged in an upper part of the reflective liquid crystal display.

This embodiment can be carried out in combination with Embodiment 3.

[Embodiment 7]p The liquid crystal display manufacture by using the present invention can be used in the display portion of various electronic equipments. Following can be given as such electronic equipments: video cameras; digital cameras; projectors (rear type or front type); head mounted displays (goggle type displays); game equipments; car navigation systems; personal computers; portable information terminals (mobile computers, portable telephones or electronic books etc.) etc. Examples of these are shown in FIGS. 13, 14 and 15.

FIG. 13A is a personal computer which comprises: a main body 7001; an image input section 7002; a display portion 7003; and a key board 7004. The present invention can be applied to the image input section 7002 and the display portion 7003.

FIG. 13B is a video camera which comprises: a main body 7101; a display portion 7102, a voice input section 7103; operation switches 7104; a battery 7105 and an image receiving section 7106. The present invention can be applied to the display portion 7102.

FIG. 13C is a mobile computer which comprises: a main body 7201; a camera section 7202; an image receiving section 7203; operation switches 7204 and a display portion 7205. The present invention can be applied to the display portion 7205.

FIG. 13D is a goggle type display which comprises: a main body 7301; a display portion 7302; and an arm section 7303. The present invention can be applied to the display portion 7302.

FIG. 13E is a player using a recording medium which records a program (hereinafter referred to as a recording medium) which comprises: a main body 7401; a display portion 7402; a speaker section 7403; a recording medium 7404; operation switches 7405. This device uses DVD (digital versatile disc), CD, etc. for the recording medium, and can be used for music appreciation, film appreciation, games and Internet. The present invention can be applied to the display portion 7402.

FIG. 13F shows a digital camera, containing a main body 7501, a display portion (A) 7502, a view finder portion 7503, operation switches 7504, a display portion (B) 7505 and battery 7506. The electronic equipments of the present invention can be used in the display portion (A) 7502 and the display portion (B) 7505. Further, in a case where the display portion (B) 7505 is used for an operation panel, the power consumption can be reduced by displaying white-colored characters on a black-colored background.

Figure 14A:
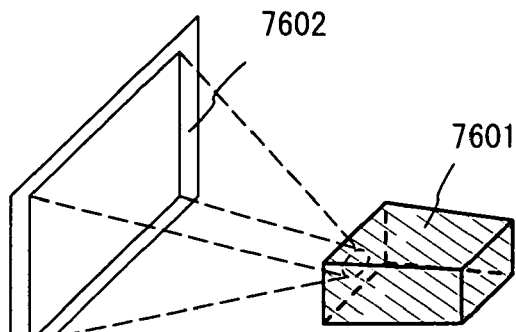
FIGS. 14A to 14D are diagrams showing projectors each employing a liquid crystal display of the present invention.

FIG. 14A is a front type projector which comprises: an optical light source system and a display portion 7601; and a screen 7602. The present invention can be applied to the display portion 7601.

Figure 14B:
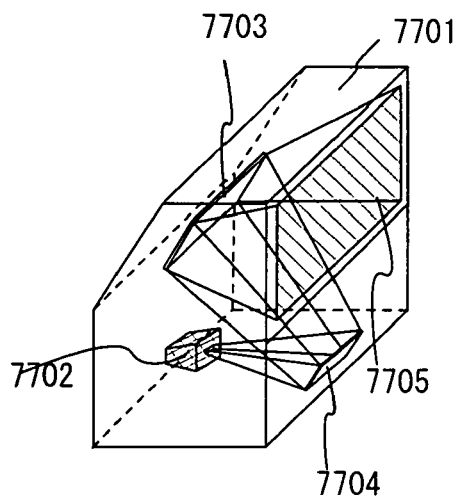

FIG. 14B is a rear type projector which comprises: a main body 7701; an optical light source system and a display portion 7702; a mirror 7703; a mirror 7704; and a screen 7705. The present invention can be applied to the display portion 7702.

Figure 14C:
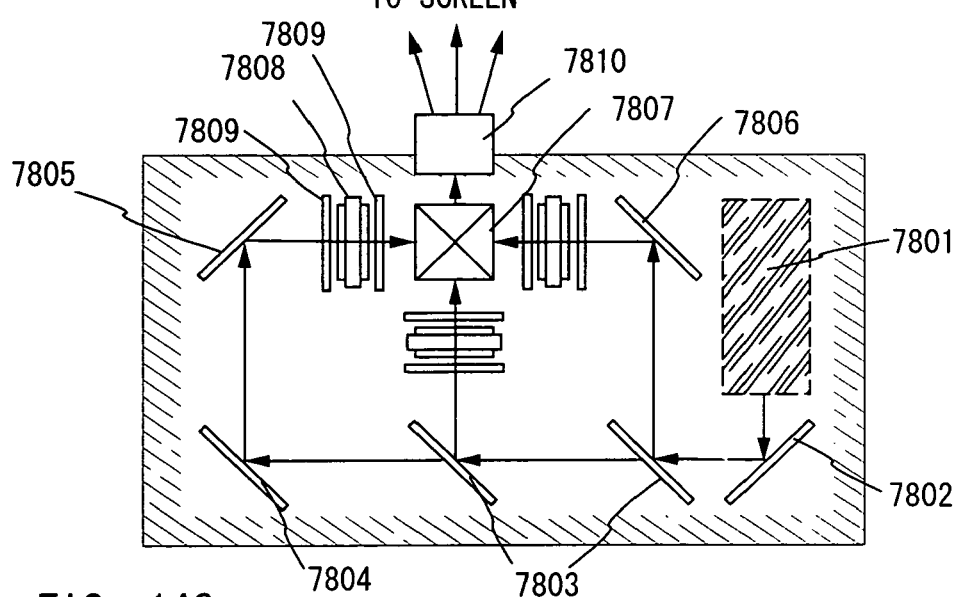

FIG. 14C is a diagram which shows an example of the structures of the optical light source system and display portions 7601 and 7702 of FIGS. 14A and 14B. Each of the optical light source system and display portions 7601 and 7702 comprises: an optical light source system 7801; mirrors 7802 and 7804 to 7806; a dichroic mirror 7803; an optical system 7807; a display portion 7808; a phase differentiating plate 7809; and a projection optical system 7810. The projection optical system 7810 comprises a plurality of optical lenses having a projection lens. This structure is called as a three-plate type in which 3 display portions 7808 are used. Further, an operator may appropriately dispose an optical lens, a film which has a function to polarize light, a film which adjusts a phase difference and an IR film, etc in the optical path shown by an arrow in FIG. 14C.

Figure 14D:
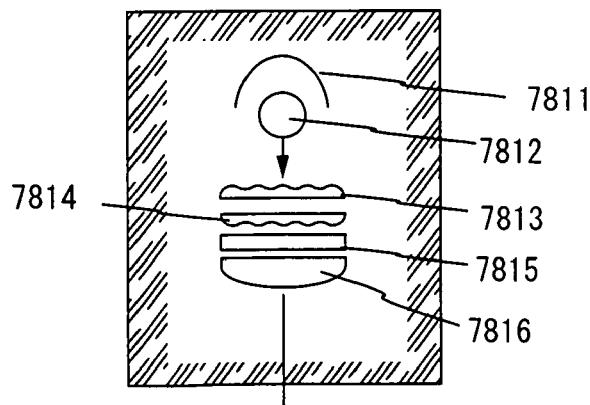

FIG. 14D is a diagram showing an example of a structure of the optical light source system 7801 in FIG. 14C. In the present embodiment, the optical light source system 7801 comprises: a reflector 7811; a light source 7812; lens arrays 7813 and 7814; a polarizer conversion element 7815; and a condensing lens 7816. Note that the optical light source system shown in FIG. 14D is merely an example and the structure is not limited to this example. For instance, an operator may appropriately dispose an optical lens, a film which has a function to polarize light, a film which adjusts a phase difference and an IR film, etc.

Figure 15A:
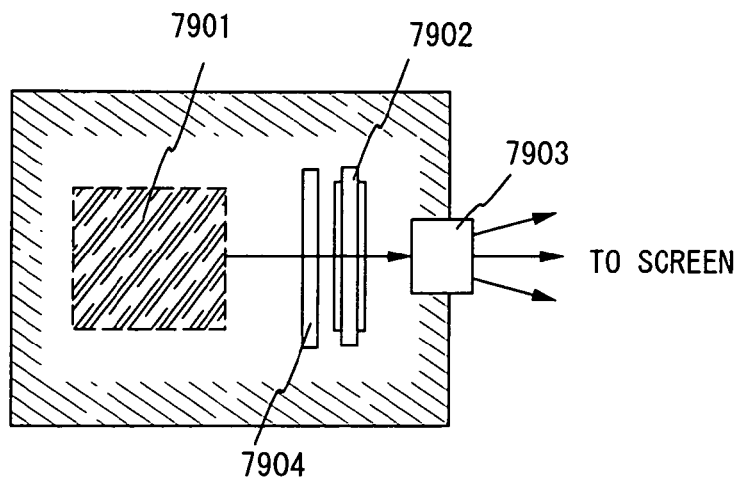
FIGS. 15A to 15C are diagrams showing projectors each employing a liquid crystal display of the present invention.

While FIG. 14C shows an example of the three-plate type, FIG. 15A is a diagram showing an example of a single plate type. The optical light source system and a display portion shown in FIG. 15A comprises: an optical light source system 7901, a display portion 7902, a projection optical system 7903 and a phase difference plate 7904. The projection optical system 7903 comprises a plurality of optical lenses including a projection lens. The light source system and a display portion shown in FIG. 15A can be applied to the optical light source systems and display portions 7601 and 7702 shown in FIGS. 14A and 14B. An optical light source system shown in FIG. 14D may be used as the optical light source system 7901. Note that a color filter is disposed in the display portion 7902 (not shown) and the displayed image is colored.

Figure 15B:
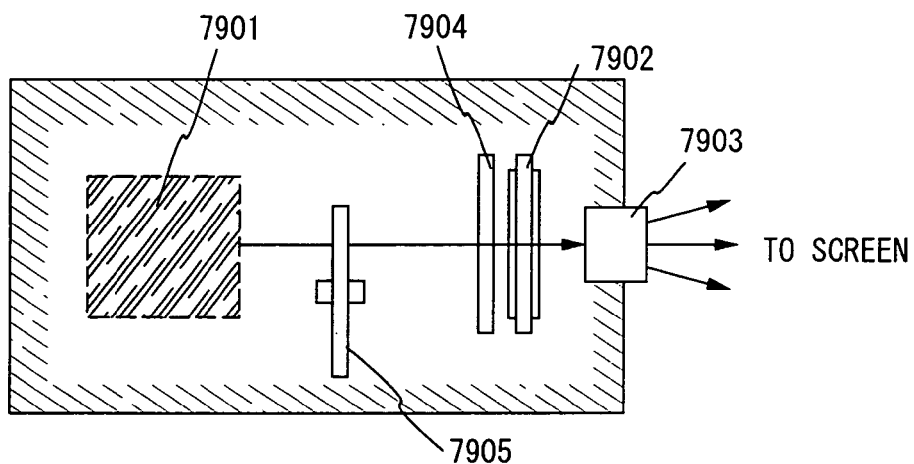

An optical light source system and a display portion shown in FIG. 15B is an application of FIG. 15A and the displayed image is colored by using a rotating color filter circular plate 7905 of RGB in place of disposing a color filter. The light source system and a display portion shown in FIG. 15B can be applied to the optical light source systems and display portions 7601 and 7702 shown in FIGS. 14A and 14B.

Figure 15C:
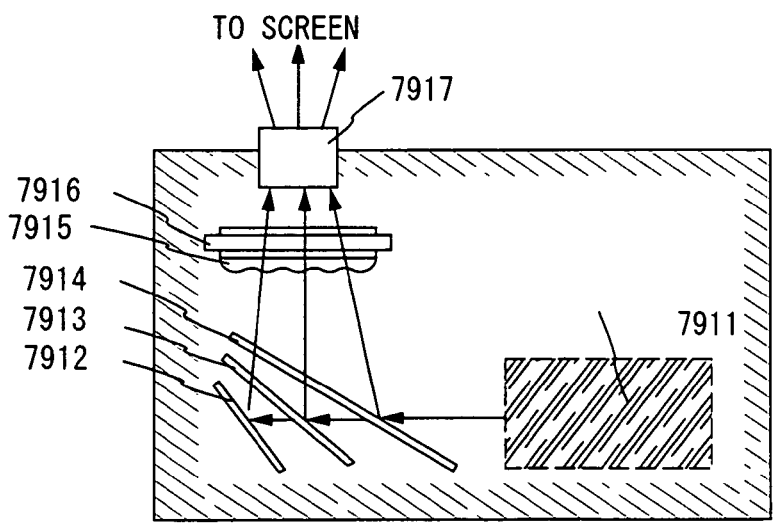

An optical light source system and a display portion shown in FIG. 15C is called as a color-filter-less single plate system. This system disposes a micro lens array 7915 in the display portion 7916, and the displayed image is colored by using a dichroic mirror (green) 7912, a dichroic mirror (red) 7913 and a dichroic mirror (blue) 7914. The projection optical system 7917 comprises a plurality of optical lenses including a projection lens. The light source system and a display portion shown in FIG. 1C can be applied to the optical light source systems and display portions 7601 and 7702 shown in FIGS. 14A and 14B. Further as an optical light source system 7911, an optical system using a coupling lens and a collimator lens in addition to the light source may be used.

As described above, the applicable range of the present invention is very large, and it is possible to apply to electronic equipments of various fields. Further, electronic equipments of Embodiment 7 can be accomplished with a combination of any of Embodiments 1 to 6.

With the structure of the present invention, the surface of the insulating film can be leveled and TFTs formed on the insulating film thus can be saved of poor characteristics. Moreover, the polishing by CMP helps to reduce the bending of the substrate which is caused by the stress of the insulating film, to a certain degree.

The shielding film can block light from the active matrix substrate side which otherwise would irradiate the TFT, thereby preventing the light from increasing OFF current of the TFT. Being formed on the active matrix substrate side, the shielding film needs only a limited margin for positioning itself, thereby improving the aperture ratio.

The shielding film can be formed above the TFT and a wiring with an interlayer insulating film interposed between the shielding film and the TFT and the wiring, in addition to employing the structure of the present invention, namely, forming the shielding film between the active layer of the TFT and the substrate. Then light can more securely be prevented from entering the active layer, in particular, the channel formation region.

When the shielding film is formed between the active matrix substrate and the active layer of the TFT, the wiring may be formed simultaneously. If the same material is used for the wiring and the shielding film and if the wiring is a gate signal line or a source signal line, image disturbance (discrimination) caused by orientation disorder in a liquid crystal material between pixels can be prevented.

A shielding film for the opposite substrate may be added to the structure of the present invention.

What is claimed is:

1. A semiconductor device comprising:
   a shielding film and a gate signal line formed on an insulating surface;
   a planarization insulating film formed so as to cover the shielding film and the gate signal line; and
   a thin film transistor formed over the planarization insulating film,
   wherein the shielding film overlaps the thin film transistor with the planarization insulating film sandwiched therebetween.

2. A device according to claim 1, wherein thicknesses of the shielding film and the gate signal line are 0.1 μm to 0.5 μm.

3. A device according to claim 1, wherein the shielding film and the gate signal line are tapered.

4. A digital camera comprising a semiconductor device according to claim 1.

5. A video camera comprising a semiconductor device according to claim 1.

6. A goggle type display device comprising a semiconductor device according to claim 1.

7. An audio system comprising a semiconductor device according to claim 1.

8. A notebook personal computer comprising a semiconductor device according to claim 1.

9. A portable information terminal comprising a semiconductor device according to claim 1.

10. A DVD player comprising a semiconductor device according to claim 1.

11. The semiconductor device according to claim 1, wherein the planarization film is formed by polishing an insulating film by CMP.

12. The semiconductor device according to claim 1, wherein the insulating surface is a surface of a substrate.

13. A semiconductor device comprising:
a shielding film and a gate signal line formed on an insulating surface;
a planarization insulating film formed so as to cover the shielding film and the gate signal line; and
a thin film transistor including an active layer, the transistor being formed over the planarization insulating film,
wherein the active layer has a channel formation region, and
wherein the shielding film overlaps the channel formation region with the planarization insulating film sandwiched therebetween.

14. A device according to claim 13, wherein thicknesses of the shielding film and the gate signal line are 0.1 μm to 0.5 μm.

15. A device according to claim 13, wherein the shielding film and the gate signal line are tapered.

16. A digital camera comprising a semiconductor device according to claim 13.

17. A video camera comprising a semiconductor device according to claim 13.

18. A goggle type display device comprising a semiconductor device according to claim 13.

19. An audio system comprising a semiconductor device according to claim 13.

20. A notebook personal computer comprising a semiconductor device according to claim 13.

21. A portable information terminal comprising a semiconductor device according to claim 13.

22. A DVD player comprising a semiconductor device according to claim 13.

23. The semiconductor device according to claim 13, wherein the planarization film is formed by polishing an insulating film by CMP.

24. The semiconductor device according to claim 13, wherein the insulating surface is a surface of a substrate.

25. A semiconductor device comprising:
a lower layer capacitance wiring and a gate signal line formed on an insulating surface;
a planarization insulating film formed over the lower layer capacitance wiring and the gate signal line;
a capacitance wiring formed over the planarization insulating film; and
a pixel electrode electrically connected to the capacitance wiring,
wherein the lower layer capacitance wiring overlaps the capacitance wiring with the planarization insulating film sandwiched therebetween.

26. A device according to claim 25, wherein thicknesses of the lower layer capacitance wiring and the gate signal line are 0.1 μm to 0.5 μm.

27. A device according to claim 25, wherein the lower layer capacitance wiring and the gate signal line are tapered.

28. A device according to claim 25, wherein the thickness of the planarization insulating film is 0.5 μm to 1.5 μm.

29. A digital camera comprising a semiconductor device according to claim 25.

30. A video camera comprising a semiconductor device according to claim 25.

31. A goggle type display device comprising a semiconductor device according to claim 25.

32. An audio system comprising a semiconductor device according to claim 25.

33. A notebook personal computer comprising a semiconductor device according to claim 25.

34. A portable information terminal comprising a semiconductor device according to claim 25.

35. A DVD player comprising a semiconductor device according to claim 25.

36. The semiconductor device according to claim 25, wherein the planarization film is formed by polishing an insulating film by CMP.

37. The semiconductor device according to claim 25, wherein the insulating surface is a surface of a substrate.

38. A semiconductor device comprising:
a shielding film, a lower layer capacitance wiring and a lower layer wiring formed on an insulating surface;
a planarization insulating film formed over the shielding film, the lower layer capacitance wiring and the lower layer wiring;
a thin film transistor including an active layer, the thin film transistor being formed over the planarization insulating film; and
a capacitance wiring formed over the planarization insulating film,
wherein the active layer has a channel formation region,
wherein the shielding film overlaps the channel formation region with the planarization insulating film sandwiched therebetween,
wherein the lower layer capacitance wiring overlaps the capacitance wiring with the planarization insulating film sandwiched therebetween, and
wherein the thin film transistor has a gate electrode electrically connected to the lower layer wiring.

39. A device according to claim 38, wherein the shielding film, the lower layer capacitance wiring and the lower layer wiring each has a thickness of 0.1 μm to 0.5 μm.

40. A device according to claim 38, wherein the shielding film, the lower layer capacitance wiring and the lower layer wiring are tapered.

41. A device according to claim 38, wherein the thickness of the planarization insulating film is 0.5 μm to 1.5 μm.

42. A digital camera comprising a semiconductor device according to claim 38.

43. A video camera comprising a semiconductor device according to claim 38.

44. A goggle type display device comprising a semiconductor device according to claim 38.

45. An audio system comprising a semiconductor device according to claim 38.

46. A notebook personal computer comprising a semiconductor device according to claim 38.

47. A portable information terminal comprising a semiconductor device according to claim 38.

48. A DVD player comprising a semiconductor device according to claim 38.

49. The semiconductor device according to claim 38, wherein the planarization film is formed by polishing an insulating film by CMP.

50. The semiconductor device according to claim 38, wherein the insulating surface is a surface of a substrate.

51. A method of manufacturing a semiconductor device, comprising the steps of:
  forming a shielding film and a gate signal line over an insulating surface;
  forming an insulating film so as to cover the shielding film and the gate signal line;
  polishing the insulating film to form a planarization insulating film; and
  forming a thin film transistor over the planarization insulating film,
  wherein the shielding film overlaps the thin film transistor with the planarization insulating film sandwiched therebetween.

52. A method according to claim 51, wherein thicknesses of the shielding film and the gate signal line are 0.1 µm to 0.5 µm.

53. A method according to claim 51, wherein the shielding film and the gate signal line are tapered.

54. A method according to claim 51, wherein the thickness of the planarization insulating film is 0.5 µm to 1.5 µm.

55. The method of manufacturing a semiconductor device according to claim 51, wherein the semiconductor device is incorporated into an electronic appliance selected from the group consisting of a video camera, a digital camera, a projector, a head mounted display, a game equipment, a personal computer, a portable telephone, a navigation system, an electronic book, an audio system, a DVD player and a mobile computer.

56. The method of manufacturing a semiconductor device according to claim 51, wherein the insulating film is polished by CMP.

57. The method of manufacturing a semiconductor device according to claim 51, wherein the insulating surface is a surface of a substrate.

58. A method of manufacturing a semiconductor device, comprising the steps of:
  forming a shielding film and a gate signal line over an insulating surface;
  forming an insulating film so as to cover the shielding film and the gate signal line;
  polishing the insulating film to form a planarization insulating film; and
  forming a thin film transistor including an active layer over the planarization insulating film,
  wherein the active layer has a channel formation region, and
  wherein the shielding film overlaps the channel formation region with the planarization insulating film sandwiched therebetween.

59. A method according to claim 58, wherein thicknesses of the shielding film and the gate signal line are 0.1 µm to 0.5 µm.

60. A method according to claim 58, wherein the shielding film and the gate signal line are tapered.

61. A method according to claim 58, wherein the thickness of the planarization insulating film is 0.5 µm to 1.5 µm.

62. The method of manufacturing a semiconductor device according to claim 58, wherein the semiconductor device is incorporated into an electronic appliance selected from the group consisting of a video camera, a digital camera, a projector, a head mounted display, a game equipment, a personal computer, a portable telephone, a navigation system, an electronic book, an audio system, a DVD player and a mobile computer.

63. The method of manufacturing a semiconductor device according to claim 58, wherein the insulating film is polished by CMP.

64. The method of manufacturing a semiconductor device according to claim 58, wherein the insulating surface is a surface of a substrate.

65. A method of manufacturing a semiconductor device, comprising the steps of:
  forming a lower layer capacitance wiring and a gate signal line over an insulating surface;
  forming an insulating film over the lower layer capacitance wiring and the gate signal line;
  polishing the insulating film to form a planarization insulating film;
  forming a capacitance wiring over the planarization insulating film; and
  forming a pixel electrode electrically connected to the capacitance wiring,
  wherein the lower layer capacitance wiring overlaps the capacitance wiring with the planarization insulating film sandwiched therebetween.

66. A method according to claim 65, wherein thicknesses of the lower layer capacitance wiring and the gate signal line are 0.1 µm to 0.5 µm.

67. A method according to claim 65, wherein the lower layer capacitance wiring and the gate signal line are tapered.

68. A method according to claim 65, wherein the thickness of the planarization insulating film is 0.5 µm to 1.5 µm.

69. The method of manufacturing a semiconductor device according to claim 65, wherein the semiconductor device is incorporated into an electronic appliance selected from the group consisting of a video camera, a digital camera, a projector, a head mounted display, a game equipment, a personal computer, a portable telephone, a navigation system, an electronic book, an audio system, a DVD player and a mobile computer.

70. The method of manufacturing a semiconductor device according to claim 65, wherein the insulating film is polished by CMP.

71. The method of manufacturing a semiconductor device according to claim 65, wherein the insulating surface is a surface of a substrate.

72. A method of manufacturing a semiconductor device, comprising the steps of:
  forming a shielding film, a lower layer capacitance wiring and a lower layer wiring over an insulating surface;
  forming an insulating film so as to cover the shielding film, the lower layer capacitance wiring and the lower layer wiring;
  polishing the insulating film to form a planarization insulating film; and
  forming a capacitance wiring and a thin film transistor that includes an active layer over the planarization insulating film,
  wherein the active layer has a channel formation region,
  wherein the shielding film overlaps the channel formation region with the planarization insulating film sandwiched therebetween,
  wherein the lower layer capacitance wiring overlaps the capacitance wiring with the planarization insulating film sandwiched therebetween, and
  wherein the thin film transistor has a gate electrode electrically connected to the lower layer wiring.

73. A method according to claim 72, wherein the shielding film, the lower layer capacitance wiring and the lower layer wiring each has a thickness of 0.1 μm to 0.5 μm.

74. A method according to claim 72, wherein the shielding film, the lower layer capacitance wiring and the lower layer wiring are tapered.

75. A method according to claim 72, wherein the thickness of the planarization insulating film is 0.5 μm to 1.5 μm.

76. The method of manufacturing a semiconductor device according to claim 72, wherein the semiconductor device is incorporated into an electronic appliance selected from the group consisting of a video camera, a digital camera, a projector, a head mounted display, a game equipment, a personal computer, a portable telephone, a navigation system, an electronic book, an audio system, a DVD player and a mobile computer.

77. The method of manufacturing a semiconductor device according to claim 72, wherein the insulating film is polished by CMP.

78. The method of manufacturing a semiconductor device according to claim 72, wherein the insulating surface is a surface of a substrate.

* * * * *